(12) United States Patent
Dziekan et al.

(10) Patent No.: US 12,138,894 B2
(45) Date of Patent: Nov. 12, 2024

(54) REINFORCEMENT STRUCTURE AND PROCESS FOR REINFORCEMENT OF A PANEL ELEMENT

(71) Applicant: Photon AG, Berlin (DE)

(72) Inventors: Thomas Dziekan, Berlin (DE); Uriel Tradowsky, Berlin (DE); Andreas Knaub, Berlin (DE); Robert Braun, Berlin (DE); Lukas Neumann, Berlin (DE); Holger Alder, Berlin (DE)

(73) Assignee: Photon AG, Berlin (DE)

( * ) Notice: Subject to any disclaimer, the term of this patent is extended or adjusted under 35 U.S.C. 154(b) by 43 days.

(21) Appl. No.: 17/372,743

(22) Filed: Jul. 12, 2021

(65) Prior Publication Data

US 2022/0016865 A1    Jan. 20, 2022

(30) Foreign Application Priority Data

Jul. 14, 2020  (EP) .................................... 20185657
Oct. 1, 2020   (EP) .................................... 20199587

(51) Int. Cl.
*B32B 3/08*     (2006.01)
*B32B 7/08*     (2019.01)
(Continued)

(52) U.S. Cl.
CPC ................. *B32B 3/08* (2013.01); *B32B 7/08* (2013.01); *B32B 7/12* (2013.01); *B32B 15/011* (2013.01);
(Continued)

(58) Field of Classification Search
CPC ...... G06F 30/23; G06F 30/15; G06F 2113/24; G06F 2113/28; G06F 30/20; B64C 3/187;
(Continued)

(56) References Cited

U.S. PATENT DOCUMENTS 2,389,767 A * 11/1945 Dalton ...................... B64C 1/06
                                                    244/119
7,124,982 B2 * 10/2006 Brofeldt ................... B64C 1/12
                                                    244/119
(Continued)

FOREIGN PATENT DOCUMENTS

JP          2008189265 A  *  8/2008

OTHER PUBLICATIONS

Rais-Rohani, M., and J. Lokits. "Reinforcement layout and sizing optimization of composite submarine sail structures." Structural and Multidisciplinary Optimization 34.1 (2007): 75-90. (Year: 2007).*
(Continued)

*Primary Examiner* — Ryan J. Walters
(74) *Attorney, Agent, or Firm* — MaxGoLaw PLLC

(57) ABSTRACT

A method for stiffening a sheet element is provided. The method includes a first step of providing stiffening modules each having a flange and at least one web. The stiffening modules are attached to the sheet element sequentially along a load path, where the stiffening modules are connected to each other via their respective flanges for a positive, frictional and/or materially bonded connection to form a stiffening structure, such that the stiffening modules have a combined effect, specifically stiffening and reinforcing the sheet element. A stiffening structure for a sheet element is also provided that has a plurality of stiffening modules arranged sequentially, and to a stiffening system that includes a stiffening structure and a sheet element.

14 Claims, 17 Drawing Sheets

Figure 1:
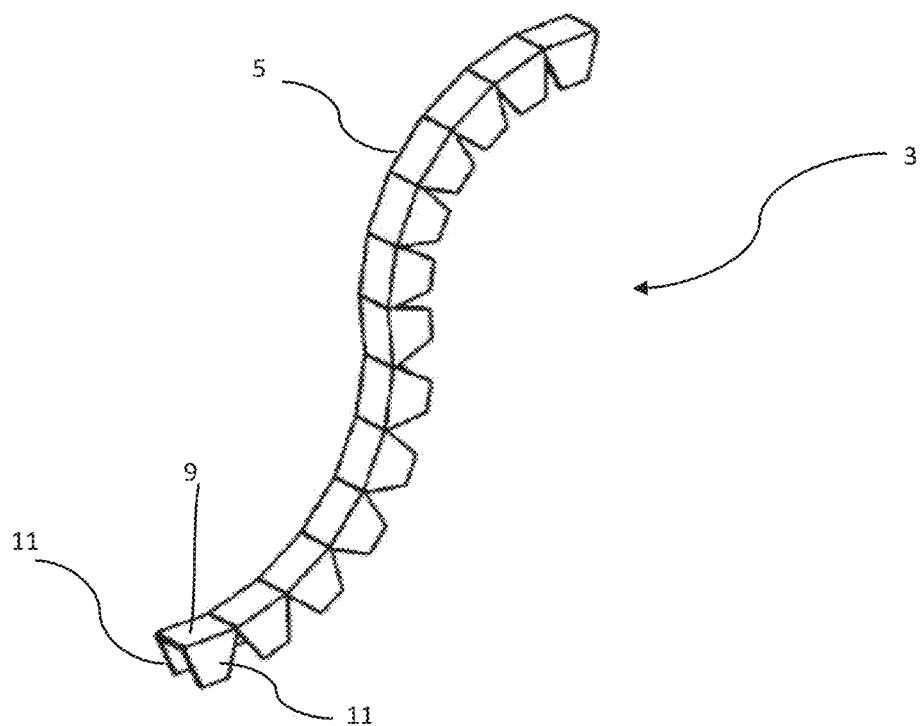

(51) Int. Cl.
  *B32B 7/12*    (2006.01)
  *B32B 15/01*   (2006.01)
  *B32B 15/20*   (2006.01)
  *B61D 17/04*   (2006.01)
  *B64C 1/06*    (2006.01)
  *G06F 30/15*   (2020.01)
  *G06F 30/20*   (2020.01)
  *B61D 17/08*   (2006.01)
  *B63B 3/28*    (2006.01)

(52) U.S. Cl.
  CPC ............ *B32B 15/016* (2013.01); *B32B 15/20* (2013.01); *B61D 17/041* (2013.01); *B64C 1/064* (2013.01); *G06F 30/15* (2020.01); *G06F 30/20* (2020.01); *B32B 2605/10* (2013.01); *B32B 2605/12* (2013.01); *B32B 2605/18* (2013.01); *B61D 17/08* (2013.01); *B63B 3/28* (2013.01)

(58) Field of Classification Search
  CPC ........... B64C 3/28; B64C 1/064; B60R 21/13; B60R 2021/132; B32B 3/08; B32B 7/08; B32B 7/12; B32B 15/011; B32B 15/016; B32B 15/20; B32B 2605/10; B32B 2605/12; B32B 2605/18; B61D 17/041; B61D 17/08; B63B 3/28; Y02T 30/00; Y02T 90/00
  See application file for complete search history.

(56) References Cited

U.S. PATENT DOCUMENTS 9,988,136 B2 * 6/2018 Tiryaki .................. B22F 7/004
11,052,949 B2 * 7/2021 Yamada ............... B62D 25/087

OTHER PUBLICATIONS

Clausmeyer, Till, et al. "Modeling and finite element simulation of loading-path-dependent hardening in sheet metals during forming." International Journal of Plasticity 63 (2014): 64-93 (Year: 2014).*

* cited by examiner

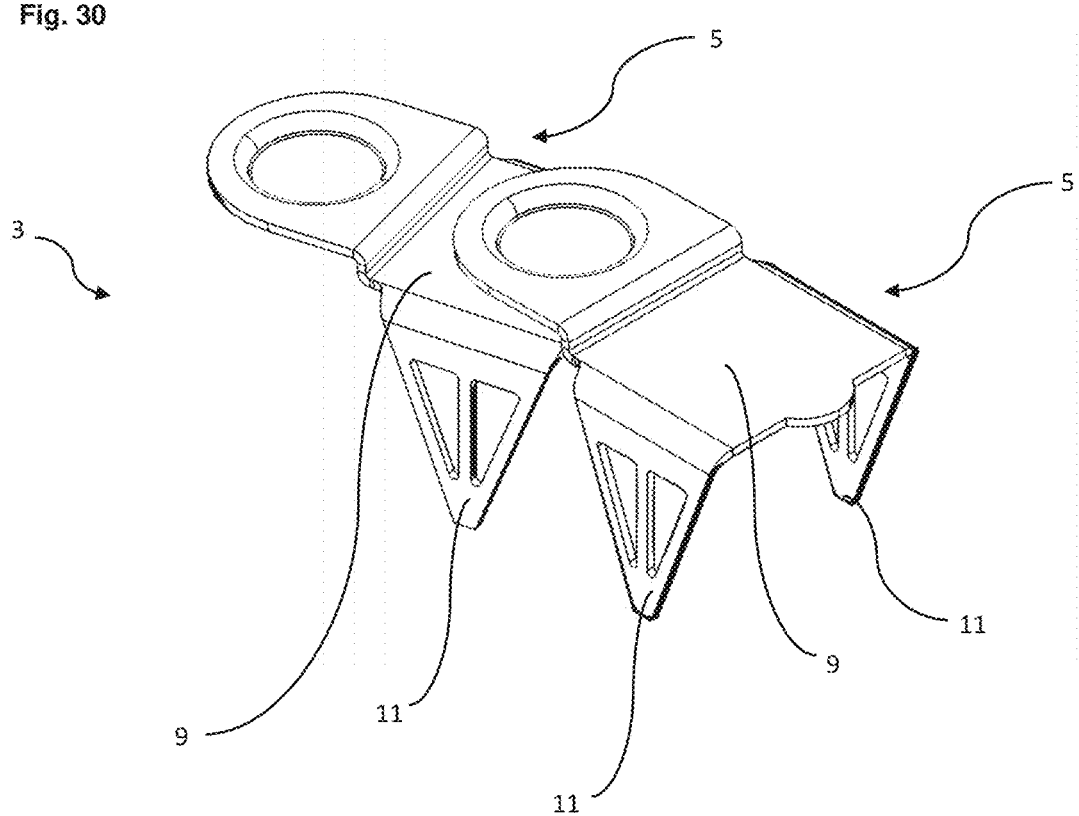

REINFORCEMENT STRUCTURE AND PROCESS FOR REINFORCEMENT OF A PANEL ELEMENT

FIELD OF THE INVENTION

The invention preferably relates to a method for stiffening a sheet element. Preferably, the method comprises a first step of providing stiffening modules comprising a flange and at least one web. Furthermore, the stiffening modules are preferably attached to the sheet element sequentially along a load path, wherein the stiffening modules are connected to one another via their respective flanges using connecting means and/or joining methods for a positive, frictional and/or materially bonded connection to form a stiffening structure, such that the stiffening modules have a combined effect, specifically the stiffening and reinforcement of the sheet element.

In preferred embodiments, at least one topology-optimized load path is determined with respect to the sheet element based on stress-optimized calculations and/or simulations, which is preferably non-rectilinear. Subsequently, a stiffening module is constructed along the load path, which is sequenced into modular units. The stiffening modules can be manufactured based on the resulting sequences, whereby conventional manufacturing methods can advantageously be used.

The invention also preferably relates to a stiffening structure for a sheet element comprising a plurality of stiffening modules arranged sequentially, and to a stiffening system comprising a stiffening structure and a sheet element.

BACKGROUND AND PRIOR ART

Structural stiffening elements are specifically introduced into components in order to increase the stiffness of a lightweight construction. The aim of these stiffening elements is to give the component a higher load-bearing capacity with a constant dead weight.

In the prior art, stiffening structures on flat structures are realized in almost all applications and industries by means of "ribs/stiffeners/frames" (also known as "stringers"). These "ribs" are largely realized from linear profiles due to the simple and inexpensive production that has developed over time.

In most applications, due to the ease of availability of the profiles, the "linear" construction method has prevailed for large structures, e.g. in structural engineering and especially in the construction of vehicle bodies (railway vehicle manufacturing, aircraft construction, shipbuilding, commercial vehicles, etc.).

Based on the possible designs, as influenced by the manufacturing systems, these ribs are each designed for a local maximum stress and are thus oversized in other areas compared to what is necessary. This oversizing firstly consumes unnecessary material (resources) and secondly increases the weight of the construction, which also increases the energy requirement for locomotion and thus the $CO_2$ consumption of the vehicles.

Today, however, with the assistance of current computing and machine systems, "non-linear", stress-optimized and thus also weight-optimized design calculations and simulations are possible [1].

However, these "topology-optimized" or "bionic" (i.e. based on evolution) designs have so far failed due to the lack of manufacturing possibilities.

The 3D printing processes currently available are not capable of producing large structures such as the Bionic Aircraft (Bionic Aircraft is an EU-funded research project that uses bionic designs to improve resource efficiency in aviation) or similar body elements for other types of vehicles.

"3D printing" is a popular option for the production of bionic structures. The currently available very low build-up rate and other technological disadvantages limit its application to components with a maximum edge length of one meter. High-performance 3D printing processes currently achieve build-up rates of a maximum of 10 kg of material per hour. Intricate bionic structures cannot be realized with these. The distortion caused by high energy input makes the shell structure unusable.

A linear profile construction of a current train sidewall, especially ICE4 sidewall, weighs 105 kilograms and is 20% heavier than the required bionic structure. However, this is built up in several manual steps in only 4.8 hours on the outer skin sheet, in a partially automated laser-welding process that exhibits a low incidence of distortion or requirement of post-treatment. With this manufacturing process using vertical and horizontal stiffeners, at 22 kg of material per hour, higher "build-up rates" can be achieved than with a 3D printing process.

Due to their complex shapes, structures topologically optimized according to bionic principles cannot be produced using conventional manufacturing processes. The prior art allows linear structures that represent a framework of vertical columns and horizontal beams. As the size of the individual elements increases, the pre-production of the individual parts becomes more complex. Although additive manufacturing processes are well suited for complex 3D shapes, large-volume 3D printing is not ready for the market in the foreseeable future. The order rates are too low, the process-related component distortion is too high and there is a lack of process reliability.

Furthermore, stiffening structures for sheet elements are known from the prior art which are suitable for achieving weight savings, however, these stiffening structures have the disadvantageous linear design already discussed.

For example, JP 2008 189265 A discloses a stiffening structure integrated in a (rail) vehicle chassis. The stiffening structure is composed of a plurality of components. In particular, the stiffening structure comprises two vertical stiffening modules, these being interrupted by a beam extending transversely to these stiffening modules. The two stiffening modules included in the disclosed stiffening structure each comprise a flange and two webs. The flanges are thereby interconnected by a connection plate which bridges the beam extending transversely to the stiffening modules.

EP 2 628 677 A1 relates to a stiffening structure for aircraft. In one disclosed embodiment, the stiffening structure comprises two stiffening modules, each comprising a flange and two webs and further being connected to each other via a coupling element at the webs.

DE 691 524 C discloses a stiffening structure for walls of ships. The stiffening structure comprises a linear L-section steel beam to which a plurality of webs are attached at a distance from each other along its longitudinal axis via connecting means. The webs are angled, with two webs arranged one behind the other being oriented in opposite directions to each other.

U.S. Pat. No. 2,389,767 A discloses a stiffening structure for aircraft structures. The stiffening structure comprises a linear beam formed by webs and a continuous flange. The webs include free spaces or gaps to facilitate the crossing of stiffening structures. Accordingly, a "topology-optimized" or "bionic" design cannot be realized with these stiffening structures.

OBJECT OF THE INVENTION

The object of the invention was to eliminate the disadvantages of the prior art and to provide a method for the manufacture of non-rectilinear stiffening structures of a sheet element which, in particular, has an increased manufacturing speed, a reduced resource requirement and no limitation with respect to component sizes. Furthermore, the method is intended to enable a weight-saving and material-saving stiffening with a reduced degree of distortion.

In addition, the object of the invention was to provide a stiffening system and a stiffening structure having the advantages associated with the method.

SUMMARY OF THE INVENTION

The problem is solved by the features of the independent claims. Advantageous embodiments of the invention are described in the dependent claims.

In a preferred embodiment, the invention relates to a method for stiffening a sheet element comprising:
provision of stiffening modules comprising a flange and at least one web
mounting of the stiffening modules sequentially along a load path on the sheet element, wherein the stiffening modules are connected to one another via their respective flanges using connecting means and/or joining methods for a positive, frictional and/or materially bonded connection to form a stiffening structure, such that the stiffening modules have a combined effect, specifically the stiffening and reinforcement of the sheet element along the load path,
wherein the load path has preferably been determined for the sheet element in a topology-optimized manner on the basis of a stress-optimized simulation and/or calculation, and wherein the load path is not rectilinear.

The method according to the invention has significant advantages over the prior art. The use of preferred stiffening modules as units arranged one behind the other makes it possible to simulate and reinforce all load paths, in particular also load paths which do not run in a straight line. This advantageously enables the design of bionic structures, whereby it is also possible to manufacture the modules using conventional processes.

Furthermore, it has been shown that the positive, frictional and/or materially bonded connections of the respective flanges of the different modules to each other as well as the interrupted connection of the web sections of the modules are sufficient to obtain a required stiffening and/or reinforcement of the entire stiffening structure. In this regard, it was not anticipated that the stiffening structures would reliably withstand high stresses despite an assembly of different stiffening structures as well as an interrupted connection of the webs. The prior art has always stipulated using stiffening structures, for example a beam made of one part (preferably monolithic). Furthermore, in some variants, beams are also known which are composed of a plurality of individual parts, although the beams from the prior art are always preferred as a continuous unit in their entirety, which do not have any regular interruptions. The envisaged division of the stiffening structure into the stiffening modules according to the invention thus represents a departure from the known prior art. As will be explained in more detail below, an increased flexibility with respect to the stiffening of arbitrarily configured load paths, a simplification of the manufacturing process as well as savings of materials can advantageously be achieved.

With regard to providing the individual stiffening modules, laser beam welding in particular has proven to be an excellent joining method for connecting the flanges, although other methods for connecting the flanges may also be preferred. As a result of the connections, the stiffening structure obtains a continuous flange (also referred to hereinafter as the overall flange). In this case, the positive, frictional and/or materially bonded connections of the respective flanges of the modules withstand the high stresses to which a vehicle may be exposed, for example, in accident situations, such that no breakage occurs at the connection points even under high stresses.

In contrast to stiffening structures of the prior art, the webs can advantageously be designed in such a way that they do not constitute a connection between the stiffening modules. This leads to a situation where the webs of the individual stiffening modules can be spaced apart from each other. In addition to the advantageous embodiment of stiffening structures which do not extend in a straight line, the spacing of the respective webs enables an increased saving of materials and an associated weight saving of the stiffening structure. In contrast, known stiffening structures in the prior art have both a continuous flange and a continuous web.

The linear arrangement of modules results in a stiffening structure with an overall flange and an overall web. The overall flange is continuous due to the individual connected flanges of the connecting modules, whereas the overall web is not continuous due to the spacing of the individual stiffening modules and has free spaces or gaps.

Advantageously, conventional manufacturing processes can be used for the production of the individual stiffening modules, such as are also known, for example, for the production and processing of beams. Within the meaning of the invention, conventional manufacturing methods preferably include forming processes, separation processes and/or joining processes, which have a very high level of technological maturity due to their widespread use over decades. In this respect, these processes have few defects and are particularly economical. Examples are selected from the group: extrusion, bending, punch bending, edging, gluing, screwing, soldering, various welding processes (MIG/MAG—welding, E-hand welding . . . ), rolling, milling, turning, grinding, drilling. Modern additive manufacturing processes (3D printing) do not belong to the conventional processes.

In a preferred embodiment, the method is characterized in that the webs of the stiffening modules form contact lines with the sheet element, wherein the contact lines of the webs along a stiffening structure do not represent a continuous line. Such a design of the webs enables large savings of material. It has thereby been shown that it is advantageously not necessary to generate a stiffening structure which has a continuous overall web. Static calculations, simulations as well as real tests on prototypes have shown that the stiffening structure according to the invention with spaced webs allows sufficient stiffening, equal to a continuous overall web of the stiffening structure.

Within the meaning of the invention, the webs preferably have a contact surface. The contact surface is arranged on a surface of the webs facing away from the flanges. The contact surface serves as a connecting surface between the sheet element and the stiffening modules. In other words, the stiffening modules are attached to the sheet element via the respective contact surfaces of the webs. The outer contours of the contact surface thus define the contact lines of the webs with the sheet element.

Furthermore, the contact line may preferably also be defined as the longitudinal axis and/or center line of the contact surface and substantially be parallel to or resting on the load path.

Terms such as "substantially", "approximately", "about", "circa" etc. preferably describe a tolerance range of less than ±40%, preferably less than ±20%, particularly preferably less than ±10%, even more preferably less than ±5% and particularly less than ±1% and always include the exact value. "Similar" preferably describes variables that are "approximately equal". "Partially" preferably describes at least 5%, particularly preferably at least 10%, and even more preferably at least 20%, in some cases at least 40%.

In a further preferred embodiment, the method is characterized in that the contact length of the webs with the sheet element along a load path is smaller than the total length of the stiffening structure. Similarly, as already described in the preceding paragraphs, such an arrangement entails the spacing at intervals of the webs of two adjacent stiffening modules within a stiffening structure and/or a stiffening system.

Preferably, the contact length of a web is that length of a stiffening module which is in contact with the sheet element along the longitudinal axis of the stiffening module. Due to the fact that the flange of the stiffening structure is arranged continuously—due to connection of the individual flanges of the stiffening modules—whereas the webs are not arranged continuously, the contact length is shorter than the total length of the stiffening structure. It is also preferred that the contact length of a web of a stiffening module is shorter than the total length of the stiffening module, whereby the length along the longitudinal axis of the module is considered.

As already explained above, an essential distinguishing feature of the invention compared to the prior art is that the overall web (formed by the individual webs of the stiffening modules) comprising the stiffening structure does not have to be continuous over its entire length, but can have material gaps. In its entirety, the stiffening structure acts similarly to a known lattice girder or truss girder or bar girder. The individual webs act like bars, wherein a web can also be arranged in such a way that it acts like a plurality of bars, for example through gaps or openings.

In a preferred embodiment, the invention also relates to a method for stiffening a sheet element comprising:
identifying topology-optimized load paths on a sheet element based on stress-optimized calculations and/or simulations;
sequencing load paths into modular elements;
design of stiffening modules based on the identified sequences;
manufacture of stiffening modules;
mounting the stiffening modules sequentially along the load paths on the sheet element, so that the stiffening modules have a combined effect, namely stiffening and reinforcing the sheet element.

In a further preferred embodiment, the invention relates to a stiffening structure for a sheet element comprising at least two stiffening modules, wherein the stiffening modules are arranged sequentially along a load path, which is preferably topology-optimized for the sheet element, in a functionally connected manner, so that the stiffening modules create a combined effect.

In a further preferred embodiment, the invention relates to a stiffening system comprising a stiffening structure according to the invention or preferred embodiment thereof and a sheet element, wherein the stiffening modules are attached to the sheet element sequentially along a preferably topology-optimized load path in a functionally connected manner, so that the stiffening modules have a combined effect, namely stiffening and reinforcing the sheet element.

The person skilled in the art will recognize that preferred embodiments and advantages disclosed in connection with methods for stiffening a sheet element are equally applicable to the claimed stiffening structure and the stiffening system, and vice versa.

The following table shows an overview in which prior art methods were compared with regard to weight savings and production time.

| Method | Production of outer shell + individual parts [min] | Total seam length [m] | Joining/generation time [min] | Weight saving [%] | Overall production time [min] |
| --- | --- | --- | --- | --- | --- |
| Prior art | 10 + 45 | 4 | 3 | 0 | 58 |
| 3D printing | 10 + 0 | 240 | 444 | 20 | 454 |
| Invention | 10 + 40 | 4 | 40 | 20 | 90 |

The comparison is based on a 2 m long vertical column (as an example of a stiffening structure) joined to a sheet (as a sheet element). The "prior art" is based on the use of conventional manufacturing processes to produce a continuous stiffening structure. For the method according to the invention, manufacturing data for laser welding and laser powder deposition welding were taken as a basis for the described sequencing into stiffening modules.

The invention opens up broader fields of application for lightweight construction and enables new types of products. Compared to the prior art, the ecological impact of new, weight-optimized and resource-saving ships, trains and aircraft will improve and sustainably help to prevent $CO_2$ emissions over the entire life cycle. Due to the achievable cost reductions, a high level of market penetration can also be expected, which in turn has a multiplying effect on the achievable $CO_2$ savings.

In a preferred embodiment, the method is characterized in that it comprises the following steps:
identifying a load path on a sheet element based on calculations and/or simulations
construction of a stiffening model along the load path
sequencing the stiffening model along the load path into modular units
design and manufacture of stiffening modules based on modular units designed based on said sequencing.

The described process steps advantageously enable the manufacture of a particularly efficient stiffening structure and stiffening system, which comprise stiffening modules. It has been shown that the calculations and simulations result in ideal load paths on a sheet element, so that stiffening models can be created along these ideal load paths.

Using (computer) simulations and calculations, the behavior of components (sheet elements) and assemblies can be determined. In this way, the physical behavior of materials or components can be tested in advance with regard to functionality, stability or deformability. This leads, among other things, to savings in costs and development time.

The calculations and/or simulations of load paths on a sheet element are preferably performed on a sheet element model, where the acting loads are predefined. Preferably, computer program products for structural optimization, e.g. Altair Obstruct, are used for such simulations and calculations.

For the determination of the load paths, for example, an event can be simulated in which a van (FEM model) hits a buffer stop at a speed of 60 km/h.

However, the load paths do not have to result exclusively from a crash simulation either. Instead, a plurality (e.g. more than 10) of different real operating stresses are preferably simulated overlapping in order to obtain the load paths.

The stiffening model along the load paths is preferably designed using CAD program products. An example of such a computer program product is Creo from PTC Inc. In a preferred embodiment, the stiffening model is arranged homogeneously, so that it preferably does not have any sequencing or structuring in the sense of modules.

In a preferred embodiment, the stiffening model is preferably a model of a stiffening structure or of a stiffening module, wherein the model preferably already comprises (model) flanges and/or (model) webs. In alternative embodiments, the models may also be designed only as approximations of the stiffening structure and/or stiffening modules, which are to be produced later.

In a further preferred step, the design of the stiffening model is checked using a finite element method. The computer program product Altair Hypermesh, for example, may be used for this purpose.

The sequencing of the stiffening model along the load path into modular units can preferably be generated using different methods. A preferred variant is the manual creation of the modular units (sequences) via a CAD program product, e.g. Creo from PTC Inc. Furthermore, it is preferred to automate the sequencing. For this purpose, algorithms are used that enable optimal sequencing. These algorithms may include machine learning algorithms inter alia.

For example, non-rectilinear (curved) ideal stiffening models are mathematically approximated into linear "pieces" so that linear structural segments (models) are obtained.

After sequencing the stiffening model, further simulation and/or calculation steps may be included that optimize the modular units (sequences) in terms of material savings.

After sequencing the stiffening model, production data are preferably generated for manufacturing the individual stiffening modules.

In a further preferred embodiment, the method is characterized in that the load path for the sheet element has been determined in a topology-optimized manner on the basis of a stress-optimized simulation and/or calculation, wherein the load path is preferably not rectilinear. The topology-optimized load paths based on stress-optimized calculations are preferably determined using the above-mentioned steps.

It is understood that the goal of topology optimization is preferably to meet the requirements of a component (in this case: e.g. the preferred system, specifically a sheet element with a stiffening structure) with the lowest possible material input. Preferably, this is done by aiming for maximum stiffness or reinforcement at low volumes. This means that the stiffening structure should provide the sheet element with the highest possible degree of stiffness or reinforcement, while the stiffening structure itself and/or the sheet element requires little material and accordingly has low weight. This enables a more efficient use of materials and improves the motion dynamics due to a lower mass.

In order to achieve an optimal stiffening structure, it should preferably be applied along a load path having an effect on a sheet element. For an optimal load distribution on the sheet element, a calculation of the load paths on a predefined sheet element can preferably be performed. Ideally, based on the calculated and/or simulated load paths, a computer-aided topology optimization may be used, which preferably generates an optimal shape for the sheet element, the stiffening structure and/or the system. Based on this, the route of the flanges and webs of the preferred stiffening structure can be designed according to the determined optimal topology and load paths.

The load paths can be determined, for example—as described above—by means of a computer-aided calculation or simulation, in particular using the finite element method. Provided that the route of the stiffening structure is preferably adapted to the route of the determined load paths, an increased stiffness of the sheet element can be achieved with a simultaneous reduction in weight.

It is understood that preferably a topology-optimized stiffening structure is obtained if it is formed on a load path acting on a topology-optimized preferred system and/or preferred sheet element.

Preferably, the calculation and/or simulation of the load paths is determined as a function of a predefined stress. A predefined stress is understood to be, for example, the simulation and/or calculation of an impact of a van on a buffer stop at a predefined speed. According to the stress, for example, a van with an optimal topology can be determined which exhibits a particularly good behavior (in terms of damage) under the predefined stress, whereby preferred load paths are generated based on the topology optimization. Subsequently, stiffening structures and sheet elements can be identified accordingly.

The predefined stress is preferably optimally selected to meet the requirements of the sheet element that is to be stiffened. For example, a sheet element that is to be stiffened is subject to different stress in trains than in aircraft or in a van. Accordingly, stress-optimized simulations and/or calculations within the meaning of the invention are carried out.

The term "non-rectilinear" in the present document is preferably to be understood as synonymous with "non-linear" or also "curved". In this regard, a non-rectilinear stiffening structure exhibits at least one change in direction within its overall length. This change of direction may comprise any spatial axis.

The proposed fully digitalized and automated process (production chain) advantageously enables local value creation without a dependence on globally distributed supply networks.

Due to the preferred sequencing of topology-optimized structures into (small) modular elements, there is a much higher degree of flexibility compared to large individual parts. Modules can be joined more quickly than a generative process can build a comparable structure. In contrast to approaches for the implementation of bionic structures in the prior art, the invention therefore enables the realization of larger component dimensions, with lower manufacturing times and costs.

The present invention substantially enables a 20% weight saving in stiffeners according to the invention compared to prior art designs with rectilinear-shaped sections.

In addition to $CO_2$ savings through minimized energy consumption over the life cycle of the vehicle, the invention enables $CO_2$ savings through reduced resource requirements for manufacturing.

The method according to the invention generates up to about 80% time savings compared to assembly using 3D printing methods.

In a preferred embodiment, known/conventional manufacturing processes from the prior art are used and/or combined with each other to manufacture stiffening modules. This is possible in particular because the stiffening modules do not have geometrically complex structures and also preferably provide a small geometric design.

Preference is given to load-optimized bionic structures from industrially available CAD systems. Instead of replicating these structures identically with conventional 3D printing, they are built up modularly on the basis of a preferred innovative design principle with sequenced elements. Using a digital database and manufacturing chain, these elements are automatically positioned and joined with minimal distortion. The preferred process thus has much higher "build-up rates" than 3D printing and enables the integration of bionic designs into conventional manufacturing. In addition, the time-consuming and complex pre-processing steps previously required there for individual part generation as well as project lead times and cost-intensive equipment are no longer necessary.

The invention preferably relies on digitalized and automated process chains.

In particular, it has become apparent to the inventors that the invention has a broad industrial application and cross-industry use of the design principle. In addition, the invention enables the development of a higher level of digitalization in vehicle body production (aircraft, ship and railway vehicle construction, etc.) for common metallic materials (Fe, Al, Ti, Mg).

Other benefits include:
digitalized and automated process chains
modelling of all process steps
simulation of the production chain
process flow digitally mapped from the printed circuit board to the end product
component optimization, suitability for series production, optimization of production complexity
new design principle enables up to 20% weight savings through bionically optimized structures
reduction of manual work steps
modularized units are automatically joined to form structures that cannot be created by conventional methods By focusing on lightweight metal construction, the sustainability and recyclability of the industries also benefit compared to plastic-based lightweight fiber composite construction. Through repair by means of widely used repair technologies (including welding), railway vehicles, for example, achieve operating times of over 30 years. Furthermore, metallic materials can be 100% recycled as secondary raw materials.

Preferably, the process is based on bionic principles, according to which organic structures in nature can carry very large loads and absorb very large forces compared to their own weight. The bionic approach offers a cross-sectional function in all industries, especially in the mobility sector. A cross-sector system solution is being sought.

The achievable savings potential of the described process in terms of material, weight and $CO_2$ emissions will be illustrated below based on the examples of railway vehicle construction and aviation.

Example of Railway Vehicle Construction

The possible weight saving in the stiffening structure of a lightweight steel railway vehicle (ICE4) through bionic optimization is approx. 200 kg per carriage body (approx. 20% based on the stiffening structure in the side walls). This results in a weight reduction of approx. 2.73 t for a train with 13 carriages.

Primary savings: The reduced use of materials results in $CO_2$ savings of approx. 3.98 t $CO_2$ per train. Calculation method: 2.73 t weight saving×1.46$CO_2$/t $CO_2$ emission per ton of finished steel product [2].

Savings over the service life: This results in a savings potential of 176.68 t $CO_2$ for a train with bionically optimized reinforcement structures in the sidewalls over the lifetime. Calculation method: Ratio calculation based on reference data [3], [4].

The $CO_2$ savings over the service life due to 416 kg weight reduction per carriage body from using CFRP amounts to 350 t. A 200 kg weight reduction per carriage body results in a saving of 176.68 t $CO_2$ for the project idea.

Example of Aviation

The possible weight saving from using a bionically optimized stiffening structure (stringer) in aluminum construction is approx. 20% [5].

Example calculation with a weight saving of 5.33 t per aircraft (type A320) [6]:

Primary savings: The reduction in the use of materials results in $CO_2$ savings of 49.79 t $CO_2$ per aircraft (type A320). Calculation method: 5.33 t weight saving×9.34 t $CO_2$ emission per ton of primary aluminum production [7].

Savings over the service life: This results in a savings potential of 33,597 t $CO_2$ for an aircraft (type A320) with bionically optimized reinforcement structures in the fuselage (5.33 t weight saving) over an assumed service life of 25 years. Calculation method: 10,000 liters kerosene saving per 100 kg weight saving per aircraft (type A320) per year [8]. 1 liter of kerosene weighs approx. 0.8 kg. According to the $CO_2$ emission factor, this results in 3.15 kg of emitted $CO_2$ per kg of kerosene [9].

The automated and digitalized process chain according to the invention is preferably to be understood as a general technological approach. Due to the given bionic design freedom, the design principle is advantageously universally adaptable and applicable. The lightweight construction potential of the invention is available for all industries, in particular in the mobility sector a maximum $CO_2$ saving results over the life cycle of the products. For the individual process steps there are initial isolated technical solutions, which should be convincingly combined by the invention.

In addition, the process can be carried out extremely economically using conventional methods due to the manufacturing possibilities of the stiffening modules.

In a preferred embodiment, the method is characterized in that a stiffening module comprises a flange, a web and a contact surface, wherein a flange is arranged on a first end face of the web and the second end face serves as a contact surface.

In a preferred variant of the invention, a web as well as a flange of a module are not individual components, but serve only as designations of different component elements of the stiffening module. Alternatively, however, the web and the flange of a stiffening module may also comprise different components, such that they are connected to one another by connecting means and/or joining methods, so that together they form a stiffening module.

A sheet element is preferably a three-dimensional object whose width and/or length is much greater than its thickness. As used herein a sheet element may preferably be also denoted as a panel element or flat element. Sheet elements can also be, for example, walls, wall elements, metal sheets, plates. In this context, the sheet elements can be planar or can also have irregularities such as curvatures (for example: convex or concave, FIG. 2 or FIG. 9), furrows, beads and/or elevations. The sheet elements are preferably used in vehicles (including watercraft) and/or aircraft. Particularly preferably, the sheet elements are used in vehicles for the construction of the load-bearing shell (including side walls, body, in particular aircraft fuselage or ship's hull).

The term sequencing is preferably also understood to mean discretization.

In a further preferred embodiment, the method is characterized in that the webs of the stiffening modules have contact surfaces and the stiffening modules are attached via the contact surfaces to the sheet element. The contact surfaces are preferably arranged on the end faces of the webs. They are sufficiently large to ensure a simple and stable connection between the sheet element and the stiffening module.

In a further preferred embodiment, the method is characterized in that the stiffening modules are manufactured by separation processes, preferably laser cutting, punching and/or forming processes, preferably edging, pressing and/or bending, wherein the web and the flange of a stiffening module are respectively manufactured from separate semi-finished products, such that the web and the flange are joined together or; manufactured from an identical semi-finished product by means of a forming process.

The use of conventional manufacturing methods allows the preferred process to be advantageously economical. In addition, the conventional methods are not very prone to error due to their technological maturity.

Preferred separation processes are selected from the group comprising: laser cutting, punching, milling, grinding, drilling, sawing, die-sinking EDM, wire EDM. Preferred forming processes are selected from the group comprising: edging, pressing, bending, deep drawing, rolling.

The stiffening modules can preferably be produced in two variants. Firstly, production data of the individual parts (stiffening modules) are generated from the calculation and simulation steps described above. Subsequently, they can preferably be produced via laser cutting and edging or; punch bending.

In a further preferred embodiment, the stiffening modules are produced "just in time", so that the modules are supplied to the production plant without the need for interim storage. The advantages of "just in time" production are sufficiently known to the person skilled in the art and need not be further explained in the present document.

In a further preferred embodiment, the stiffening modules are stored, preferably with a high degree of automation in the storage. A high degree of automation can further reduce the costs of storage and accordingly also improve the economic efficiency of the stiffening structure in its entirety.

After the individual stiffening modules have been manufactured, they are further processed to form a stiffening structure or system. This is preferably done by manually installing individual stiffening modules into a sheet element which is to be stiffened, preferably a metal sheet. In an alternative embodiment, the process is automated, for example by means of a robotic gripper system. Thus, individual stiffening modules from a plurality of supplied modules are first automatically detected, subsequently gripped and then positioned into a sheet element, preferably sheet metal. Each individual stiffening module is then preferably joined (connection with the sheet metal) before the next one is installed.

After the stiffening modules are positioned, preferably sequentially along a load path, the stiffening modules are connected to each other by joining processes, wherein particularly preferably only the flanges of the respective modules are connected to each other.

In a further preferred embodiment, the method is characterized in that the sheet element is a component to be stiffened, preferably a body shell of a vehicle, preferably selected from a group comprising a railway vehicle, an aircraft or a ship.

In a further preferred embodiment, the method is characterized in that the sheet element is a component to be stiffened which has dimensions of more than one meter. Such a component may also be referred to as a large component. Advantageously, the invention also permits stiffening of large-area sheet elements and is thus particularly suitable for stiffening large components for vehicle body construction.

In a further preferred embodiment, the process is used in the body production of vehicles, in particular for stiffening load-bearing body components.

Within the meaning of the invention, the sheet element preferably has dimensions of more than one meter, more preferably more than 1.5 meters and in particular more than 2 meters. Straight bionic non-linear stiffening structures for the dimensions mentioned are not known in the prior art.

In another preferred embodiment, the method is characterized in that the stiffening modules are attached to a sheet element via the contact surfaces.

In a further preferred embodiment, the method is characterized in that the stiffening modules are connected to one another by means of connecting means and/or joining methods for a positive, frictional and/or materially bonded connection.

In a further preferred embodiment, the method is characterized in that the stiffening modules are joined together by joining methods selected from the group comprising: welding, preferably laser beam welding, arc welding, electron beam welding and/or resistance spot welding as well as soldering, screwing, riveting, gluing.

Connecting individual modules by means of subsequently used joining processes to obtain a common stiffening structure is considered a departure from the prior art. As described at the outset, linear sectional beams are typically used for the stiffening of sheet elements, which are preferably manufactured as a continuous component (preferably as a single extrusion) by means of an extrusion process. Further preferably, linear section beams may also typically be manufactured using a 2D laser cutting process and a final folding process. Another manufacturing process is 2D laser cutting followed by 2D laser welding (tailored blank manufacturing) followed by deep drawing followed by 3D laser trimming. In this regard, interrupted beams have previously not been considered suitable for stiffening. In contrast, the stiffening structure or system according to the invention is made of many individual stiffening modules. It was surprising that a subsequent joining, in particular by means of laser beam welding, of the individual stiffening modules leads to a particularly stable and rigid stiffening structure, so that even under high stresses the joints do not give way.

The use of laser beam welding also has other advantages. For example, laser beam welding can be used to produce a particularly detailed and exact connection between the flanges of adjacent stiffening modules by means of a pinpoint and precise application of energy. In addition, the effect on the microstructure is considered to be very low, which means that the stiffening modules to be joined exhibit only slight thermal distortion.

Frictional joining methods, such as screwing or riveting, may also be preferred, depending on the material. Such connections are particularly cost-effective. The fact that the webs of stiffening modules arranged next to each other are spaced apart from each other—thus creating free spaces between the modules—ensures good accessibility of the screw and rivet connections.

In a preferred embodiment, the joining process is automated and defined by the following steps:
- sensor-guided joining (preferably laser beam welding) of programmed paths in fillet welds (web-sheet element)
- sensor-based (image processing) adjustment of programmed paths (flange-flange connection)
- In particular, the flange-to-flange connections of two stiffening modules can be well checked by a camera-based system, such that the welds can be adjusted based on the image recognition algorithms In a preferred alternative embodiment, the joining process is automated and defined by the following steps:
- Recognition of the positions of the stiffening modules
- Calculation of the required connecting seams
- Adjustment of existing standard seams
- Sensor-guided joining of the generated paths (web-sheet element)
- Joining of seams (flange-to-flange) by means of previously adapted paths In a preferred alternative embodiment, the joining process is (partially) automated, e.g. based on programmed paths (web-sheet element joint and flange-flange joint).

In another preferred embodiment, the joining process is defined as a manual process. Thus, web-sheet element connections may be joined via, for example, a manual welding process. The same could also apply to the flange-to-flange joints.

In a further preferred embodiment, the joining method is defined as a combination of the aforementioned methods.

In a further embodiment, the invention relates to a stiffening structure for a sheet element comprising at least two stiffening modules of the type mentioned above, characterized in that
- the stiffening modules comprise a flange and a web
- the stiffening modules are connected to one another via their respective flanges sequentially along a non-rectilinear load path by means of connecting means and/or joining methods for a positive, frictional and/or materially bonded connection, such that the stiffening modules generate a combined effect.

The advantages and preferred embodiments of the method according to the invention are to be applied analogously to the stiffening structure according to the invention, and vice versa.

In a preferred embodiment, the stiffening structure is characterized in that a stiffening module comprises a flange, a web and a contact surface, wherein a flange is arranged on a first end face of the web and the second end face serves as a contact surface.

In a preferred embodiment, the stiffening modules each have a planar flange. Such a flange allows a good force flow in the plane and a space-saving integration (see FIG. 9-12). However, it may also be preferable to use a curved flange, which is characterized by a particularly high degree of stability along the curvature (see inter alia FIG. 18).

In a further preferred embodiment, the flanges of the stiffening modules are defined by two surfaces converging towards each other. These surfaces are preferably at an acute angle to one another (see inter alia FIG. 20). Such configurations of the flanges advantageously allow an increased amount of space underneath the flanges, such that further components can be inserted.

Furthermore, in further preferred alternative embodiments, the flanges may also be configured in such a way that the flanges each have a convex as well as a concave end face. In addition to a materially bonded connection, the convex end face of a flange of a stiffening module can be received in the concave end face of an adjacent stiffening module, such that these are also connected via a positive connection (see FIG. 26 and FIG. 27). In preferred further embodiments, the flanges have straight flange ends via which the stiffening modules are connected to one another sequentially.

In a preferred embodiment, the stiffening modules have one, two or more contact surfaces. Preferably, the support surfaces are formed by the webs. In the case of one web per stiffening module, it may be preferred to form exactly one contact surface. In the case of two or more webs, multiple contact surfaces may also be formed. In preferred embodiments, the webs have a flat web heel for this purpose, which can be applied planar to the sheet element (see inter alia FIG. 9-12). However, it may also be preferred to design the web as an open ring with a C-shaped cross-section (see FIG. 19). The contact surface of the cross-sectionally C-shaped web is preferably on the outwardly directed surface, which is positioned opposite the free surface of the C. Accordingly, the web configured in cross-section as C is arranged horizontally so that a flange can preferably be mounted on the gap of the C. With a web in the form of this embodiment, the contact surface can be minimized, while still achieving the necessary stiffening. Preferably, the contact surface can be configured to form a contact line, depending on the radius of the C's.

In a further preferred embodiment, the stiffening structure is characterized in that the stiffening modules each comprise two or more webs. The webs may, for example, be aligned parallel to each other and arranged perpendicular to the flange (see inter alia FIG. 9 or 10). Preferably, the webs may have a taper starting from the flange toward the support surface so that a gap or opening is formed between the webs. Preferably, the taper of the web may be linear or it may be non-linear, for example exponential. Furthermore, the web may preferably taper starting from the flange towards the contact surface, then widen again and then taper again so that the web assumes a convex shape from a side view.

In a preferred embodiment, the stiffening structure is characterized in that the stiffening modules each comprise a web. For example, it may be preferred substantially to position the one web centrally with respect to the flange (see inter alia FIG. 14). However, it may also be preferred to position the one web on one side of the respective flanges (see FIG. 13B) or alternately on opposite sides of the respective flanges (see FIG. 13C). Particularly with regard to a topology-optimized stiffening structure, webs can preferably be attached to flanges only on one side in certain areas in order to follow a defined load path. Very preferably, stiffening structures which have one-sided webs in certain areas (1st area) also have one-sided webs in other areas (2nd area). The webs in the second area have the webs on the opposite side compared to the first area. An area is defined by at least two stiffening modules arranged one behind the other. Preferably, an area can also comprise 3 or 5 modules (see FIG. 12B and FIG. 13B).

In a further preferred embodiment, the stiffening structure is characterized in that the stiffening modules are connected to one another via connecting means and/or joining methods for a positive, frictional and/or materially bonded connection. The advantages disclosed in connection with the methods apply analogously, whereby a person skilled in the art can determine from the finished stiffening structure which connecting or joining method has been used.

In a further preferred embodiment, the stiffening structure is characterized in that the load path for the sheet element has been determined in a topology-optimized manner using a stress-optimized simulation, wherein the load path is preferably non-linear.

Accordingly, the design of the stiffening modules can preferably be topology-optimized depending on the sheet element, whereby different stiffening modules can also be used within a stiffening structure.

In another preferred embodiment, the stiffening structure is characterized in that the flange or web of the stiffening module is formed of a material selected from the group comprising composite, steel, titanium, non-ferrous metal (preferably aluminum, copper, nickel, lead or magnesium) and plastic. A composite material may comprise, for example, a combination of all of the aforementioned materials.

The material of the stiffening modules can also preferably be combined.

Stiffening modules made of aluminum and/or steel are particularly preferred.

In another preferred embodiment, the stiffening structure comprises rollable materials/semi-finished products or materials/semi-finished products produced from an extrusion press. These include, for example, aluminum, steel or also plastic. Wood, on the other hand, is not a rollable material within the meaning of the invention.

In another preferred embodiment, the invention relates to a stiffening system comprising a stiffening structure of the type described above and a sheet element characterized in that the stiffening structure is attached to the sheet element along a load path the stiffening modules of the stiffening structure have contact surfaces and are attached to the sheet element via the contact surfaces.

The advantages and preferred embodiments of the described stiffening structure as well as the described method are applicable analogously to the stiffening system, and vice versa. Preferably, the load path for the sheet element has been determined, for example, in a topology-optimized manner on the basis of a load-optimized simulation and/or calculations, wherein the load path is in particular preferably not rectilinear.

In a further preferred embodiment, the stiffening system is characterized in that the geometric configuration of the webs of the stiffening modules is dependent on the shape of the sheet element.

Preferably, a stiffening system is a (stiffened) component or body, in particular of

BRIEF DESCRIPTION OF THE

Figure 2:
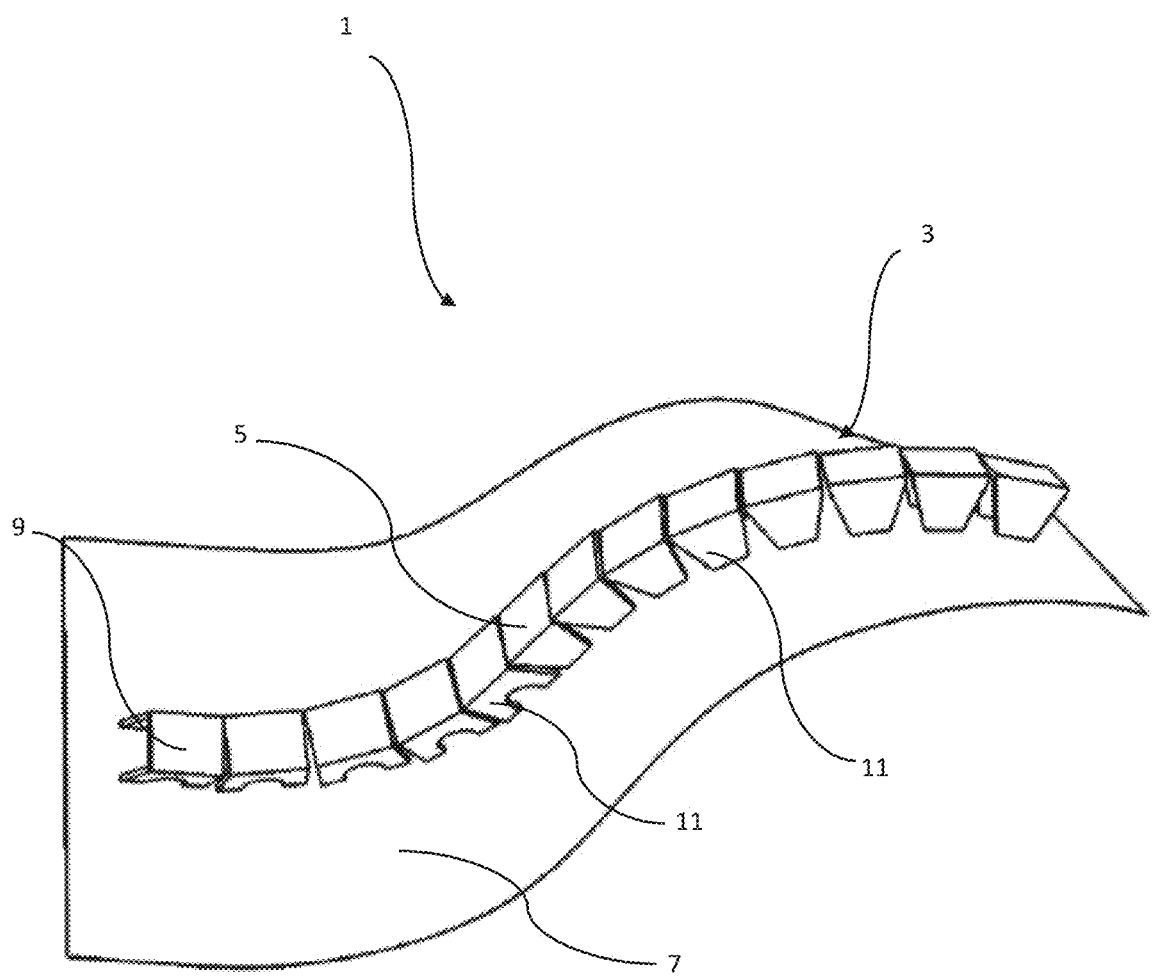
Figure 3:
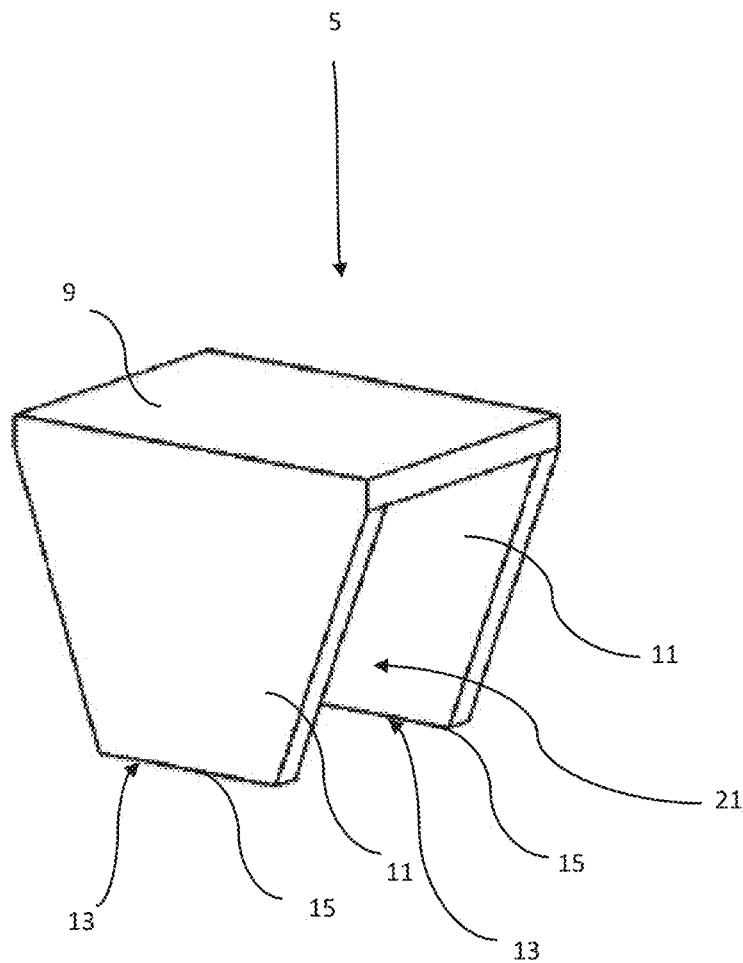
Figure 4:
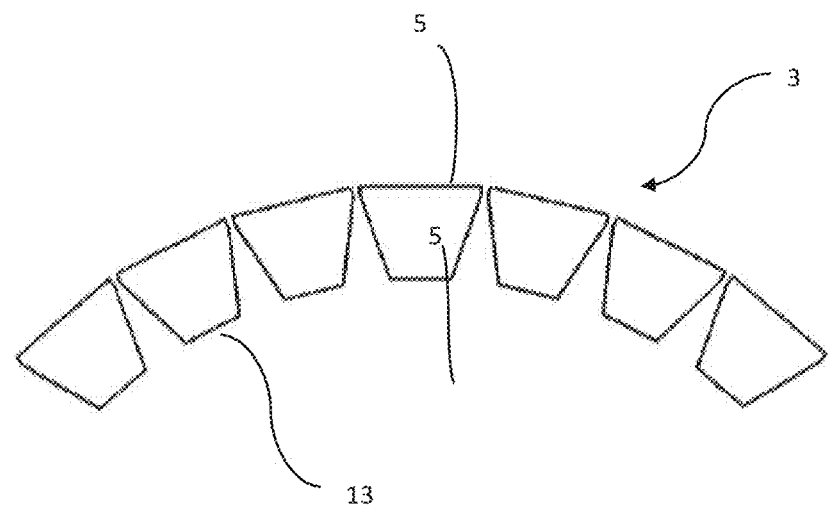
Figure 5:
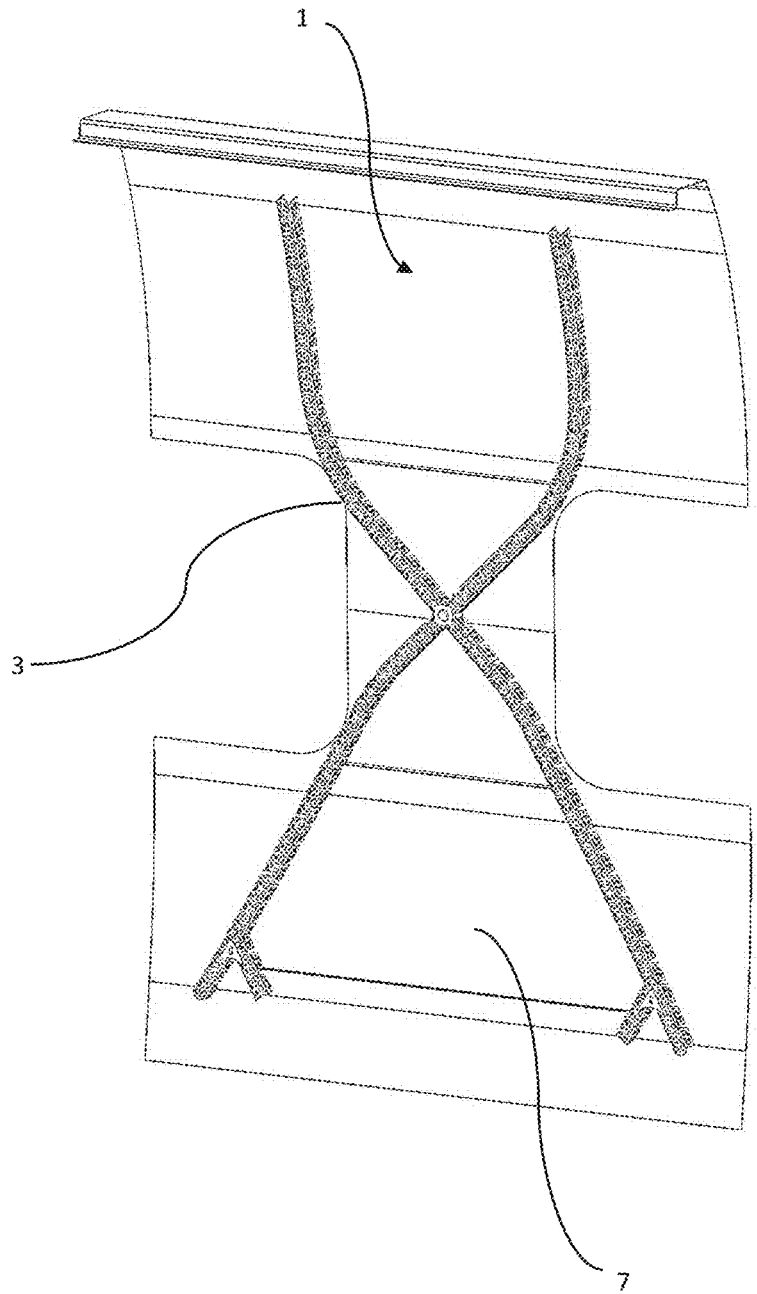
Figure 6:
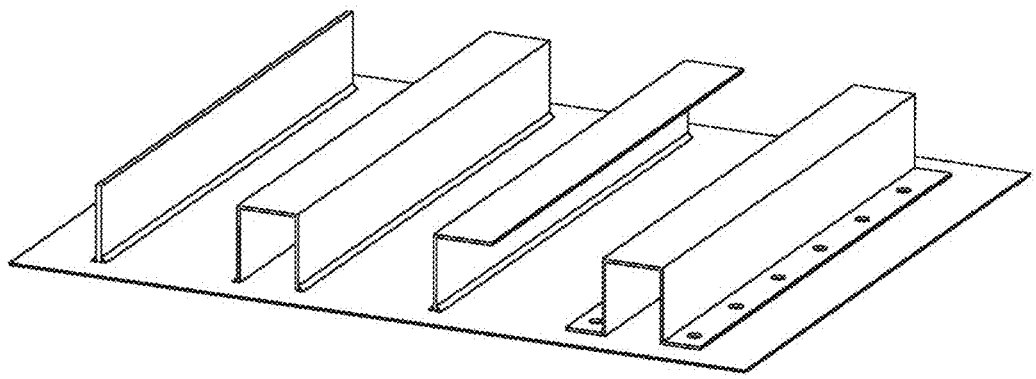
Figure 7:
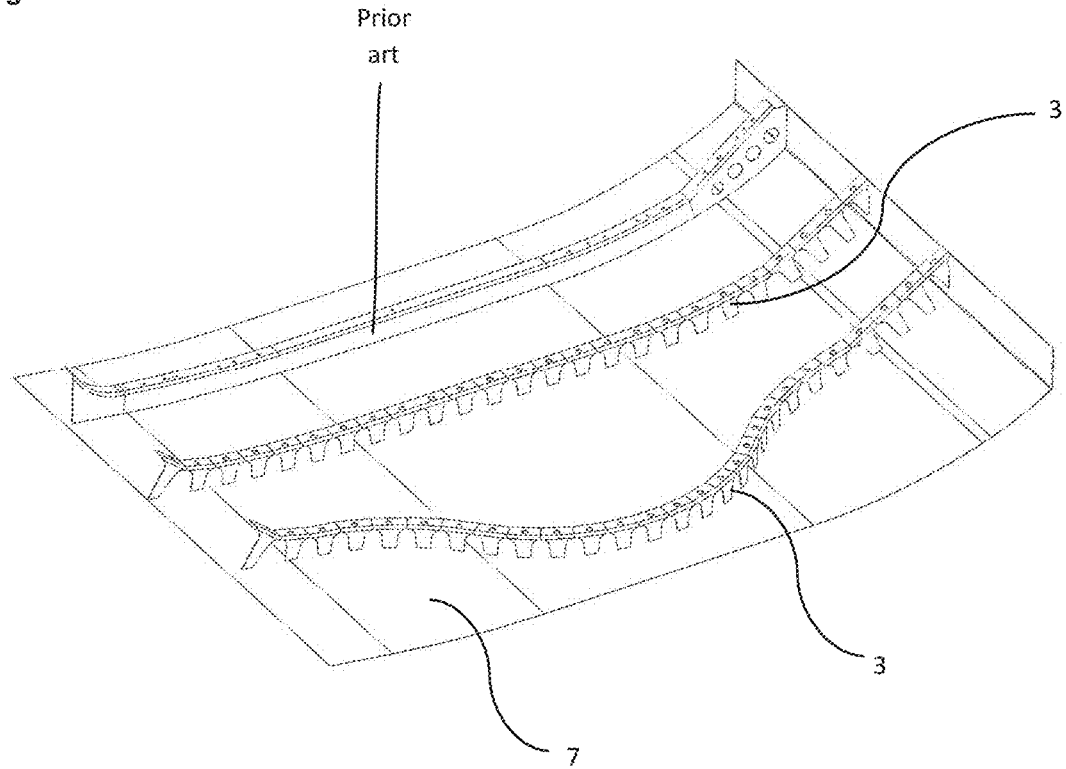
Figure 8:
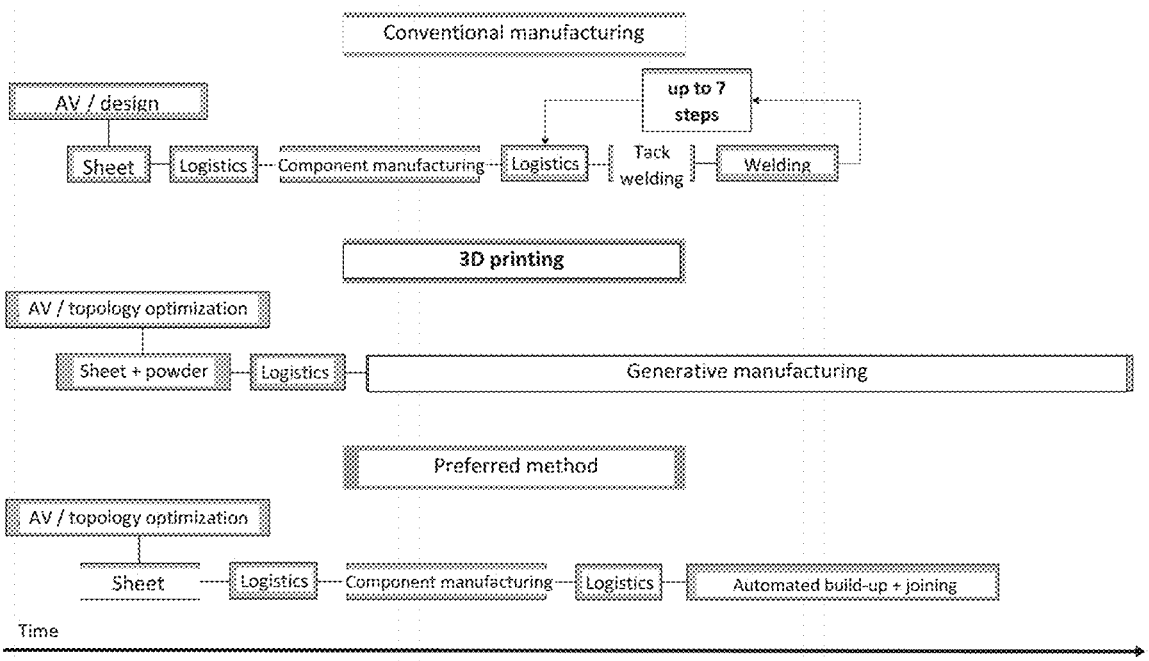
Figure 9A:
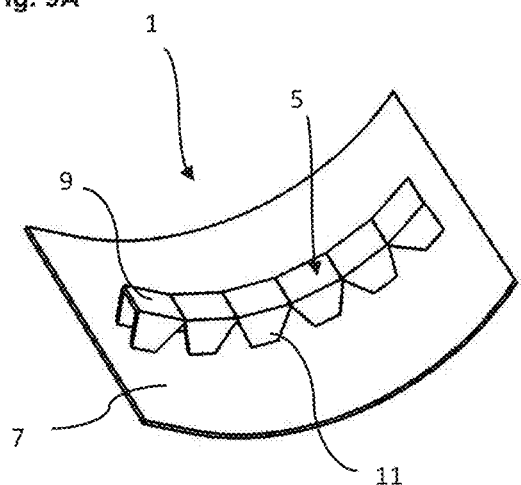
Figure 9B:
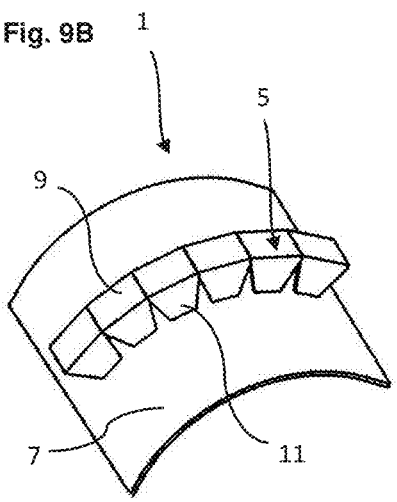
Figure 10A:
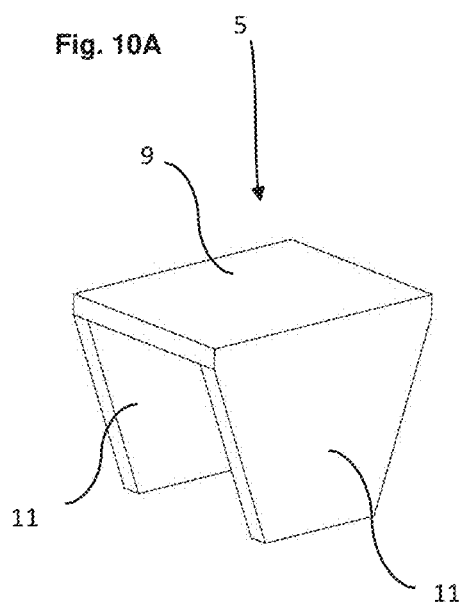
Figure 10B:
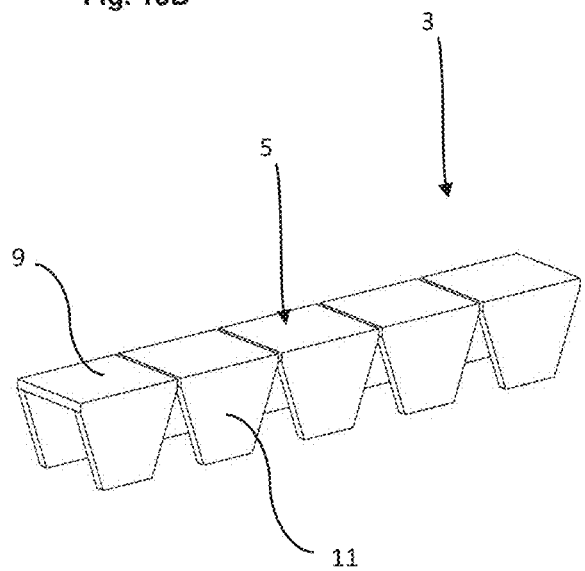
Figure 11:
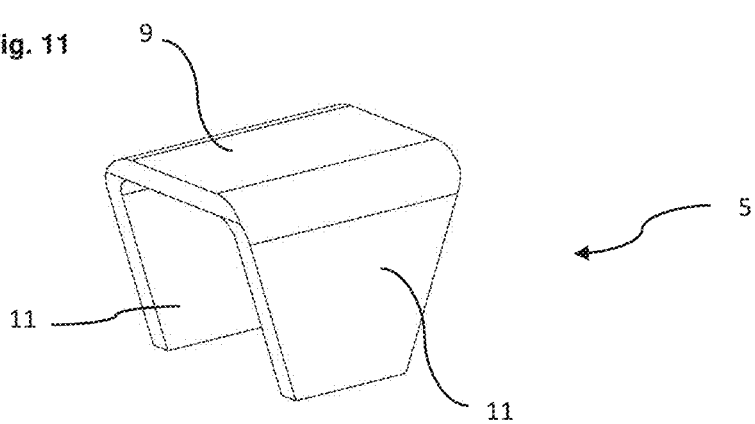
Figure 12A:
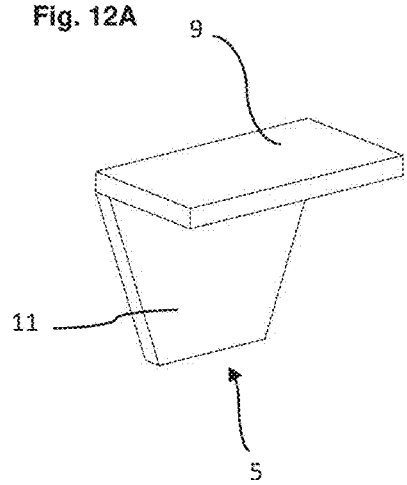
Figure 12B:
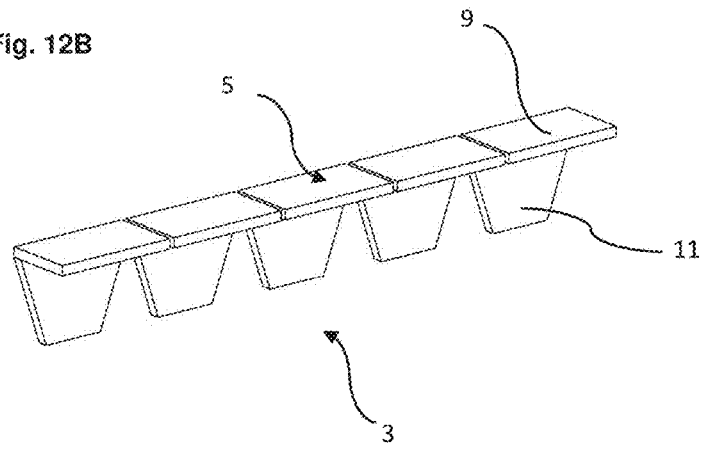
Figure 12C:
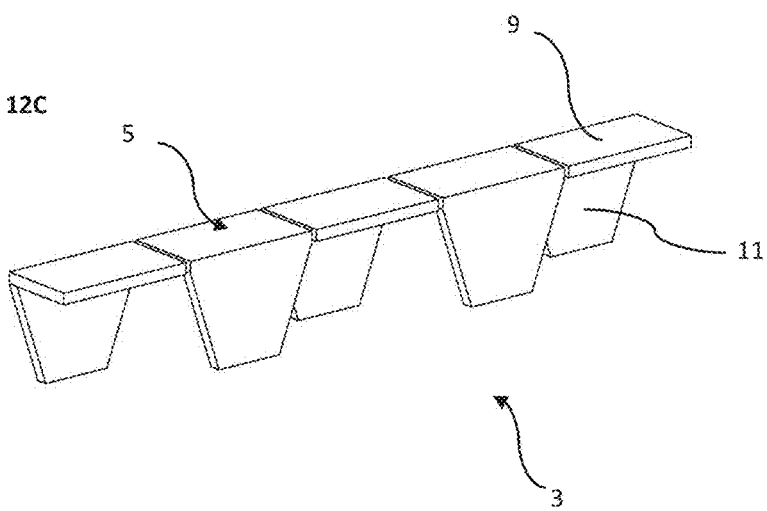
Figure 13A:
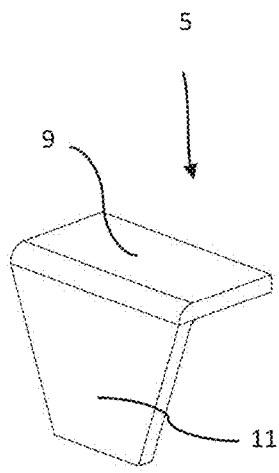
Figure 13B:
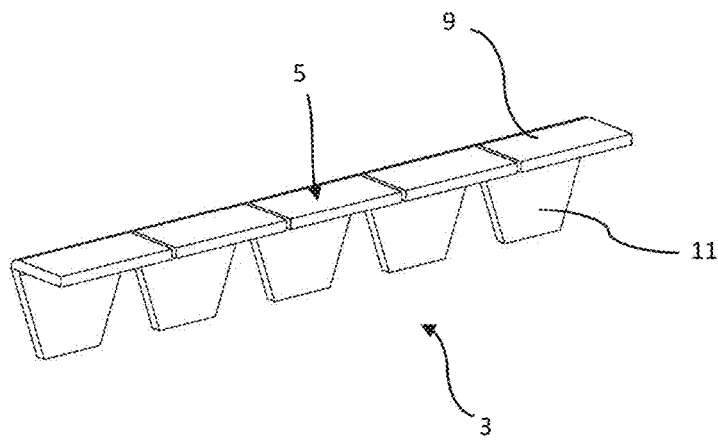
Figure 13C:
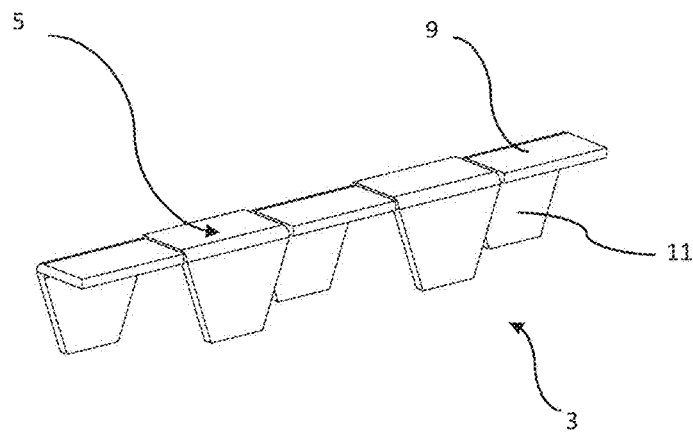
Figure 14A:
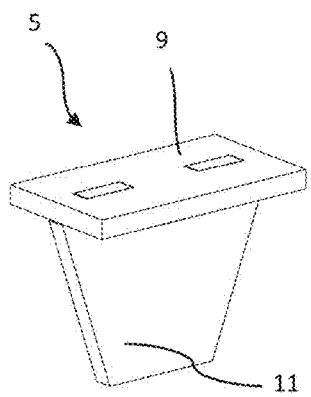
Figure 14B:
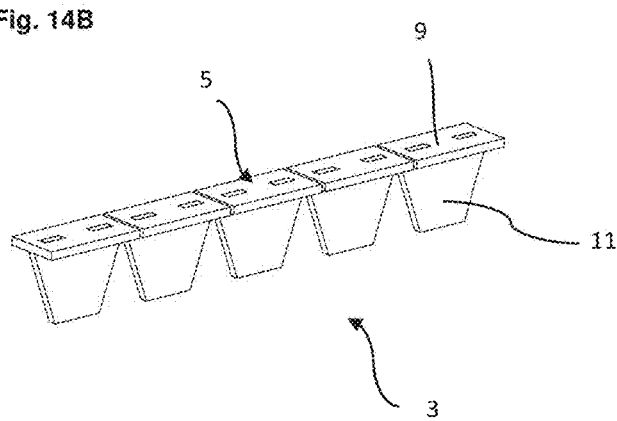
Figure 15:
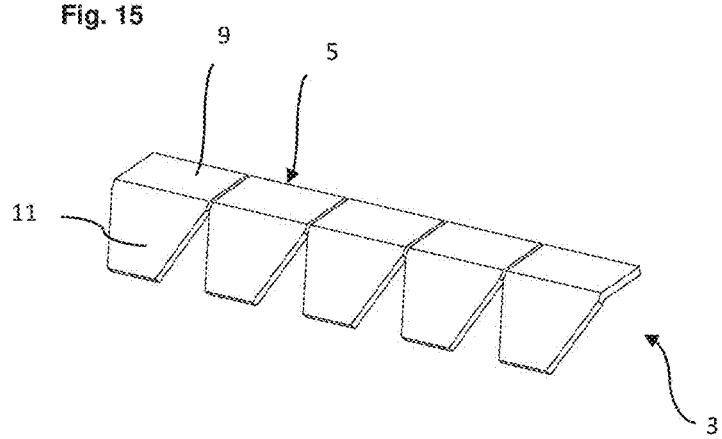
Figure 16A:
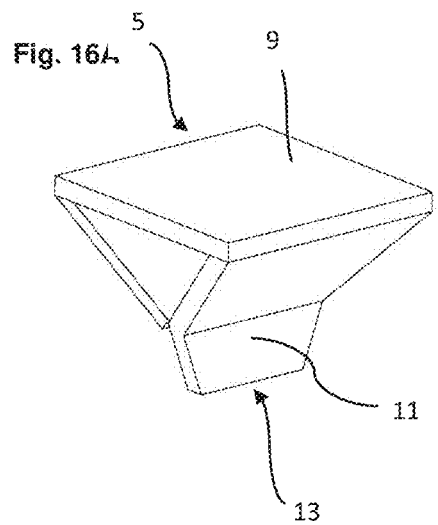

FIG. 1 Illustration of a preferred stiffening structure
FIG. 2 Illustration of a preferred stiffening system
FIG. 3 Illustration of a preferred stiffening module
FIG. 4 Illustration of a preferred stiffening structure comprising seven stiffening modules
FIG. 5 Illustration of a preferred stiffening system
FIG. 6 Schematic representation of preferred stiffeners from the prior art
FIG. 7 Comparison of preferred stiffening systems according to the invention and a stiffening system from the prior art
FIG. 8 Comparison of conventional manufacturing processes for the production of stiffening structures with a preferred process
FIG. 9A Preferred stiffening system on a concave sheet element
FIG. 9B Preferred stiffening system on a convex sheet element
FIG. 10A Preferred stiffening module with two webs
FIG. 10B Preferred stiffening structure formed by the stiffening modules of FIG. 10A
FIG. 11 Preferred stiffening module with two webs and rounded edges
FIG. 12A Preferred stiffening module with a web
FIG. 12B Preferred stiffening structure comprising stiffening modules with a web, wherein the webs are arranged sequentially
FIG. 12C Preferred stiffening structure comprising stiffening modules with a web, wherein the webs of adjacent stiffening modules are arranged opposite each other
FIG. 13 A Preferred stiffening module with a web and rounded edge
FIG. 13B Preferred stiffening structure comprising stiffening modules with a web and a rounded edge, the webs being arranged sequentially
FIG. 13C Preferred stiffening structure comprising stiffening modules with a web and a rounded edge, wherein the webs of adjacent stiffening modules are arranged opposite each other
FIG. 14A Preferred stiffening module comprising a web arranged centrally on the flange
FIG. 14B Preferred stiffening structure comprising stiffening modules with a web centrally arranged on the flange
FIG. 15 A preferred stiffening structure comprising stiffening modules, the stiffening modules having a chamfered web.
FIG. 16A Preferred stiffening module comprising a triangular-shaped web
FIG. 16B Preferred stiffening structure comprising stiffening modules with a triangular shaped web
FIG. 17A Preferred stiffening module comprising a triangular-shaped web with rounded edges
FIG. 17B Preferred stiffening structure comprising stiffening modules with a triangular shaped web and rounded edges
FIG. 18A Preferred stiffening module comprising an arched flange
FIG. 18B Preferred stiffening structure comprising stiffening modules with arched flanges
FIG. 19A Preferred stiffening module comprising a web in the form of an open ring
FIG. 19B Preferred stiffening structure comprising stiffening modules with open ring webs
FIG. 20A Preferred stiffening module comprising a tapered flange
FIG. 20B Preferred stiffening structure comprising stiffening modules with tapered flanges
FIG. 21A Preferred stiffening module comprising two webs converging towards each other
FIG. 21B Preferred stiffening structure comprising stiffening modules with two converging webs
FIG. 22A Preferred stiffening module comprising two webs converging towards each other, wherein the webs converge towards each other in a lower region
FIG. 22B Preferred stiffening structure comprising stiffening modules with two webs converging towards each other, wherein the webs converge towards each other in a lower region
FIG. 23 Preferred stiffening module with two substantially parallel webs
FIG. 24A Preferred stiffening module with two substantially parallel webs, the webs having a round lateral opening FIG. 24B Preferred stiffening module with two substantially parallel webs, the webs having a trapezoidal lateral opening FIG. 24C Preferred stiffening module with two substantially parallel webs, the webs having a plurality of round lateral openings FIG. 25A Preferred stiffening module with two substantially parallel webs, the webs tapering along a height FIG. 25B Preferred stiffening module having two substantially parallel webs, the webs tapering along a height and the webs having openings in the side surfaces FIG. 26 Preferred stiffening structure comprising stiffening modules with convex and concave flange ends FIG. 27 Preferred stiffening structure comprising stiffening modules with rectilinear flange ends FIG. 28 Preferred stiffening structure comprising stiffening modules with overlapping flanges in a side view FIG. 29 Preferred stiffening structure comprising stiffening modules with overlapping flanges in a plan view FIG. 30 Preferred stiffening structure comprising stiffening modules with overlapping flanges in a rear oblique view

DETAILED DESCRIPTION OF THE INVENTION

FIG. 1 illustrates a preferred stiffening structure 3 comprising a plurality of stiffening modules 5, a stiffening module 5 having a flange 9 and two webs 11, the webs 11 extending substantially parallel to each other in the illustrated embodiment. The individual stiffening modules 5 are connected to each other via their respective flange 9 via a positive, frictional and/or materially bonded connection. The connection of the flanges 9 generates the required stiffness of the entire stiffening structure 3. Furthermore, the webs 11 of adjacent stiffening modules 5 are not connected to each other, such that, compared to prior art solutions, there is no continuous overall web of the stiffening structure 3. This achieves a material saving without compromising stability.

FIG. 2 shows a preferred stiffening system 1. A stiffening system 1 preferably comprises a sheet element 7 and a stiffening structure 3. The preferred sheet element 7 is designed to be partly concave and partly convex. Accordingly, the individual stiffening modules 5 are designed to be correspondingly adapted, so that the webs 11 of the individual stiffening modules 5 can vary within the stiffening structure 3. According to the invention, a positive, frictional and/or materially bonded connection is preferably present only at flanges 11 of the stiffening modules 5. In contrast, the webs 11 are not connected to each other, so that free areas are formed between the webs 11.

FIG. 3 shows a preferred stiffening module 5, wherein the stiffening module 5 comprises two webs 11. The webs 11 are spaced apart from each other by a gap 21 and are connected to each other at their ends via a flange 9. The webs 11 are parallel to each other. The contact surfaces 13 of the module 5 are arranged on the downwardly directed end face. The contact surface 13 and the webs 11 define a web contact line 15.

FIG. 4 is a representation of a preferred stiffening structure 3. The stiffening structure 3 is schematically shown in a side view. The sum of the web contact lengths, which represents the projection of the web contact lines 15 in a plane (here: side view), is thereby smaller than the total length of the stiffening structure 3 projected onto the same plane. This leads to the advantageous design of the stiffening structure, such that gaps or free areas are present between the individual webs 11 of the stiffening modules 5 arranged sequentially.

FIG. 5 is an illustration of a preferred stiffening system 3. The preferred stiffening structure 3 in the form of a "curved X" is configured on a large component, preferably a railway vehicle side wall 7, between two windows mounted in the wall 7.

FIG. 6 is a representation of conventional stiffening structures from the prior art. These are in particular linear or rectilinear in design. These are sectional beams which have a continuous flange as well as a continuous web. In contrast to the stiffening structure according to the invention, the beams do not have a modular design and therefore, due to their construction, can only be manufactured in a rectilinear form.

FIG. 7 shows three different stiffening structures. A first linear or rectilinear stiffening structure is sufficiently known from the prior art. In addition, a preferred second stiffening structure 3 is linear or rectilinear and a third preferred stiffening structure 3 is non-linear or non-rectilinear. The substantial differences of the invention compared to the prior art become clear in FIG. 7. The design of non-interconnected webs 11 and the associated free spaces between the webs 11 results in the material costs being kept low. The modular design or sequencing, on the other hand, makes it possible to follow load paths which are not straight, whereby topology-optimized stiffening structures 3 can be achieved.

FIG. 8 illustrates three flowcharts. Here, the conventional prior art processes of "laser welding" and "3D printing" are compared with the preferred process according to the invention.

FIGS. 9A-B is a representation of a preferred stiffening system 1 in two different embodiments. FIG. 9A shows a stiffening system on a concave sheet element 7. FIG. 9B, on the other hand, is the representation on a convex sheet element 7. Both embodiments have the same stiffening modules 5. Within the meaning of the invention, it is possible for a sheet element 7 to have both designs—concave and convex—this is shown, for example, in FIG. 2.

FIG. 10A shows a preferred stiffening module 5, which has two substantially parallel webs 11 and is spaced apart by a gap 21 (see also FIG. 3). The flange 9, on the other hand, is substantially planar and configured at a 90° angle to the described webs 11. FIG. 10B illustrates a preferred stiffening structure 3 with five stiffening modules lined up as in FIG. 10A, wherein only the individual flanges 9 of the individual stiffening modules 5 are connected to one another and generate a continuous overall flange of the stiffening structure 3.

FIG. 11 is an illustration of a preferred stiffening module 5, wherein the stiffening module 5 has two substantially parallel webs 11. The preferred embodiment further comprises rounded edges in the transition from the flange 9 to the web 11. The rounded edges may also be formed as chamfered edges in further variants.

FIG. 12A illustrates a preferred stiffening module 5. This stiffening module 5 contains only a web 11 and a flange 9. The web 11 is attached to one side of the flange 9.

FIG. 12B furthermore forms a stiffening structure 3 via the sequential arrangement of the stiffening modules 5 from FIG. 12A. According to the invention, the stiffening modules 3 are preferably only connected to one another at the flanges 9. The stiffening structure 3 shown in FIG. 12 *b* comprises webs 11 on one side only. This contrasts with FIG. 12C, in which stiffening modules 5 arranged sequentially preferably have the webs 11 on an opposite side of the respective preceding stiffening module 5.

FIGS. 13A-C illustrates a preferred stiffening module 5 with a web 11 on one side. In contrast to the embodiment of the stiffening modules 5 shown in FIGS. 12A-C, the modules 5 shown in FIG. 13A are rounded at the transition between the web 11 and the flange 9.

The embodiments shown in FIGS. 13B and 13C are analogous to the embodiment shown in FIGS. 12A-C, although the stiffening modules 5 of the respective embodiments differ in the transition between the web 11 and the flange 9. Specifically, FIGS. 13B and 13C show stiffening modules 5 with rounded edges. Further preferably, the rounded edge may also be formed as milled or chamfered edges.

The preferred stiffening modules 5 shown in FIGS. 14A and 14B comprise a single web 11 and a flange 9, the stiffening module 5 preferably being made from two separate semi-finished products. Thus, the web 11 is a component and the flange 9 is an component independent thereof. The flange 9 and the web 11 are thus made in two parts and are connected to one another via a positive and also preferably frictional (press fit) and more preferably materially bonded connection, the web 11 having on the end face two insertion extensions which are introduced into correspondingly provided openings within the flange 9. Preferably, this is a press fit, such that the connection is sufficiently stable without further connecting means. More preferably, the insertion connection is materially bonded by a laser welding process. The stiffening structure 3 illustrated in FIG. 14B has the two-part stiffening modules 5 illustrated in FIG. 14A.

FIG. 15 illustrates a stiffening structure 3 comprising stiffening modules 5 with webs 11 designed on one side. The flange 9 of the respective stiffening modules 5 preferably comprises an angle >90° with the web 11 of the respective stiffening modules 5. The embodiment of the stiffening structure 3 shown is preferably a partial element of a sequence of stiffening structures, wherein the further stiffening structures 3 arranged in the sequence of stiffening structures can have different designs.

FIG. 16A illustrates a preferred stiffening module 5 which has a triangular web 11. The triangular web 11 engages two sides of the flange 9, wherein the web 11 converges from two sides (flange edges) and forms a triangle. In a lower region, a web heel is formed which has the contact surface 13. In a cross-section, the triangular web has the abstract shape of the letter "Y".

Figure 16B:
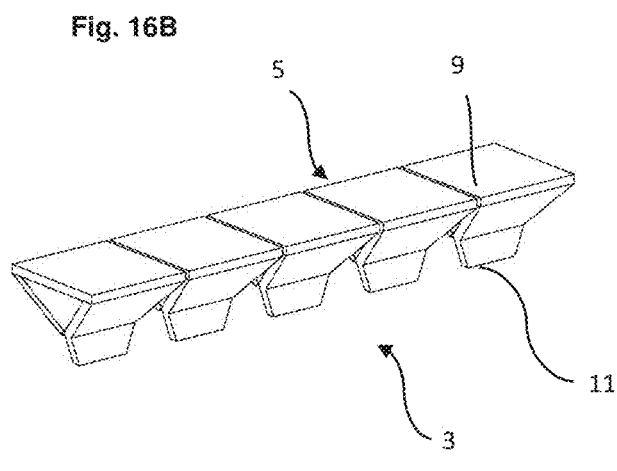

FIG. 16B shows a stiffening structure 3, wherein five of the stiffening modules 5 shown in FIG. 16A are connected to each other sequentially via a positive, frictional and/or materially bonded connection via the respective flanges 9.

Figure 17A:
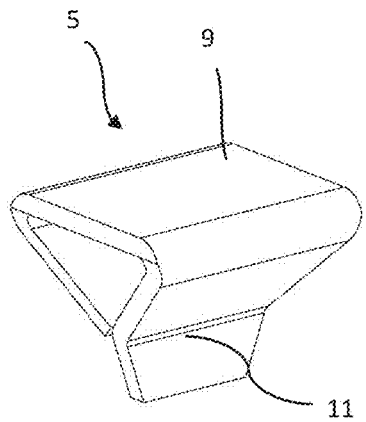

FIG. 17A shows a further variant of a preferred stiffening module 5 with a heel-providing triangular web 11. However, in comparison with the embodiment shown in FIGS. 16A and 16B, the edges at the transition from the flange 9 to the web 11 are rounded. Further preferably, the rounded edges may also be formed as milled or chamfered edges.

Figure 17B:
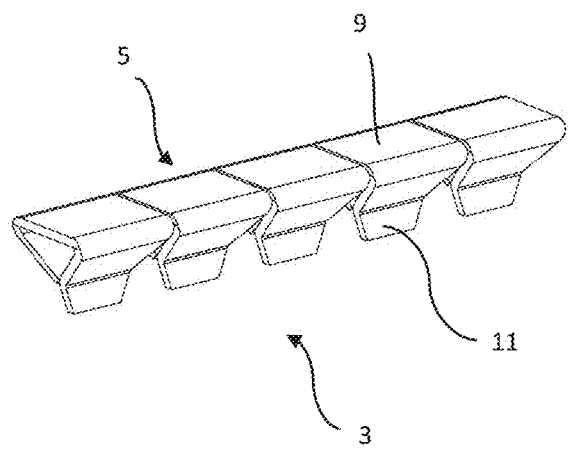

FIG. 17B illustrates a preferred stiffening structure 3 having the stiffening modules 5 shown in FIG. 17A.

Figure 18A:
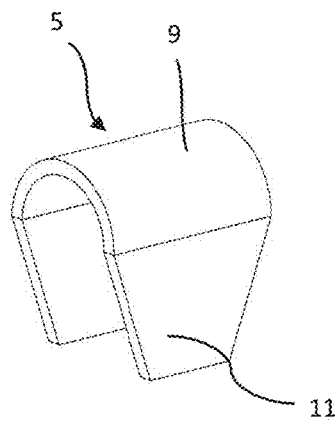

FIG. 18A shows a further embodiment of a preferred stiffening module 5. In the variant shown, the flange 9 is designed as an arch, whereas the stiffening module 5 further has two webs 11 which are spaced apart by a gap 21. The webs 11 run substantially parallel to each other.

Figure 18B:
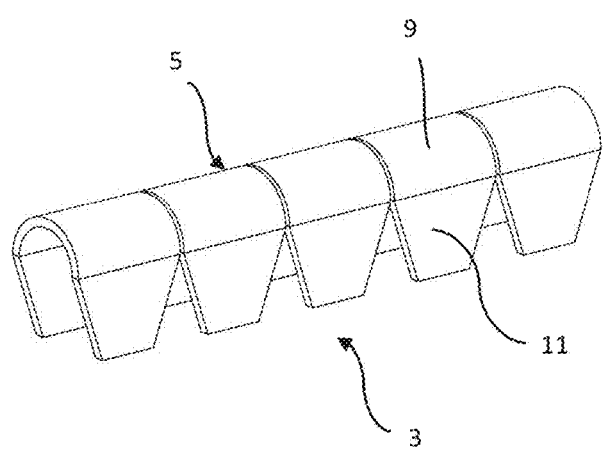

FIG. 18B illustrates five stiffening modules 5 of the embodiment according to FIG. 18A, which are arranged in a row to form a stiffening structure 5.

Figure 19A:
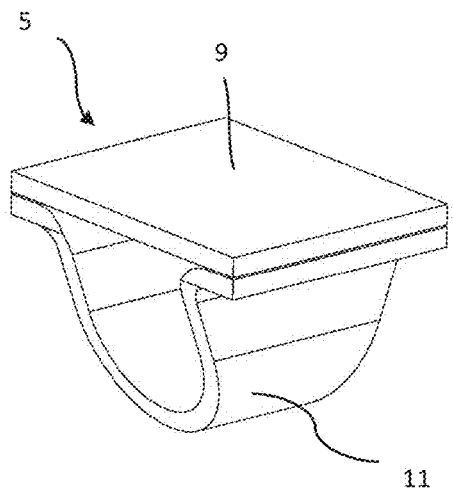

The stiffening module 5 shown in FIG. 19A has a flange 9 and a vertebral body-shaped web 11. The embodiment shown is designed to resemble a human spine. Thus, the cross-section of the web 11 is configured in a C-shape, with the open side of the C's being attached to the flange 9. Preferably, the web 11 can also be described as an open ring, wherein the opening of the ring is covered by a horizontally lying flange 9.

Figure 19B:
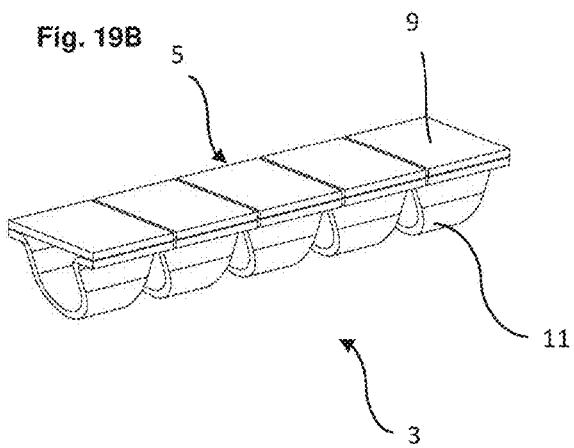

FIG. 19B illustrates a preferred embodiment of a stiffening structure 3, wherein the stiffening module 5 illustrated in FIG. 19A is arranged in rows of five. The illustrated stiffening structure 3 is in particular modelled on the spinal column of a human being. Thus, in their design, the webs 11 act like vertebral bodies of the spinal column.

Figure 20A:
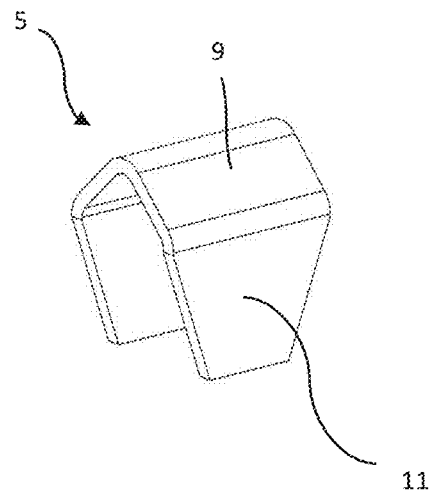

FIG. 20A shows a preferred stiffening module 5 having two webs 11 substantially parallel to each other, both webs 11 being connected to each other by a flange 9. However, this particular embodiment preferably has a flange 9 with two surfaces (roof surfaces) running towards each other. Furthermore, the edges of the stiffening module 5 are preferably chamfered.

Figure 20B:
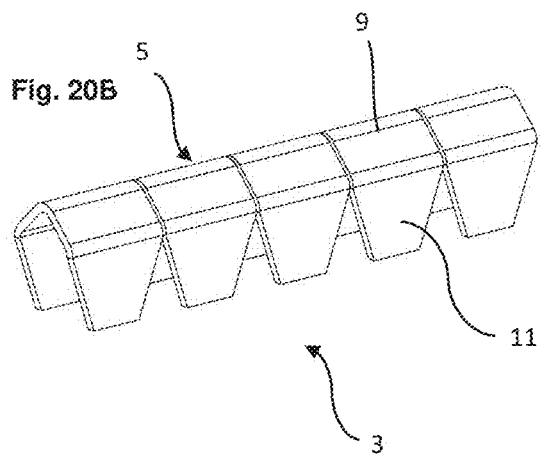

FIG. 20B illustrates a preferred stiffening structure 3. This stiffening structure 3 has five stiffening modules 5 from FIG. 20A interconnected by their flanges 9.

Figure 21A:
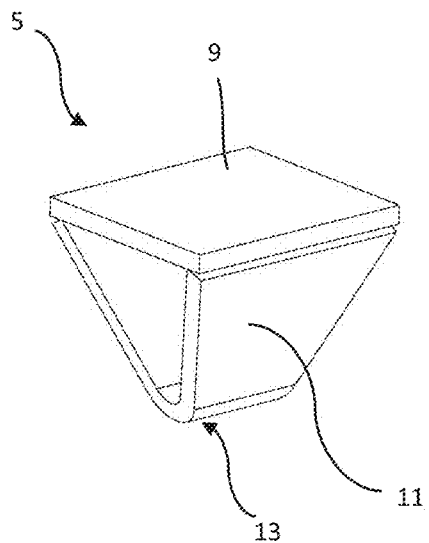

FIG. 21A is a representation of a preferred stiffening module 5. Similar to the stiffening module illustrated in FIG. 17A, the stiffening module 5 illustrated in FIG. 21A has a triangular web 11. Here, starting from two flange edges, two surfaces run towards each other and form a triangle, the apex of the triangle is flattened by a chamfer and serves as a contact surface 13 of the stiffening module 5.

Figure 21B:
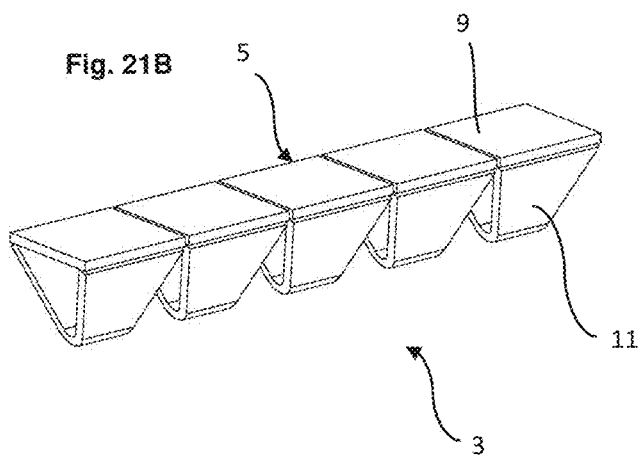

FIG. 21B illustrates a preferred stiffening structure 3, The stiffening structure 3 comprises five stiffening modules 5 of the embodiment shown in FIG. 21A.

Figure 22A:
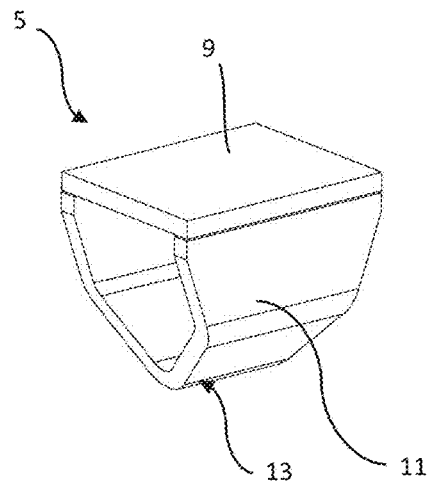

In FIG. 22A, a further preferred embodiment of a stiffening module 5 is shown. Starting from two flange edges, the web 11 included in the stiffening module 5 has two substantially parallel surfaces, these surfaces assuming a change of direction in a lower region of the stiffening module 5 and converging towards one another so that they form a common contact surface 13.

Figure 22B:
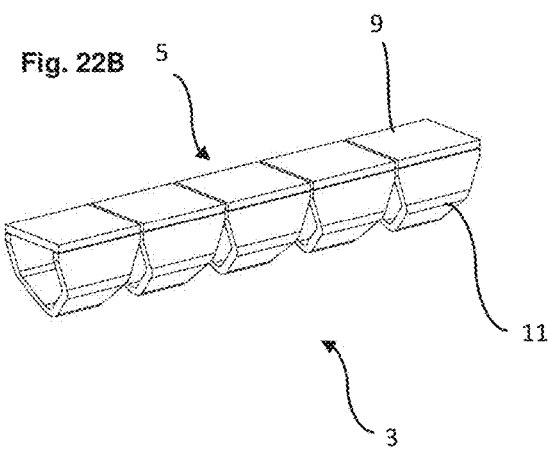

FIG. 22B illustrates a preferred stiffening structure 3. The stiffening structure 3 comprises five stiffening modules 5 of the embodiment shown in FIG. 22A.

Figure 23:
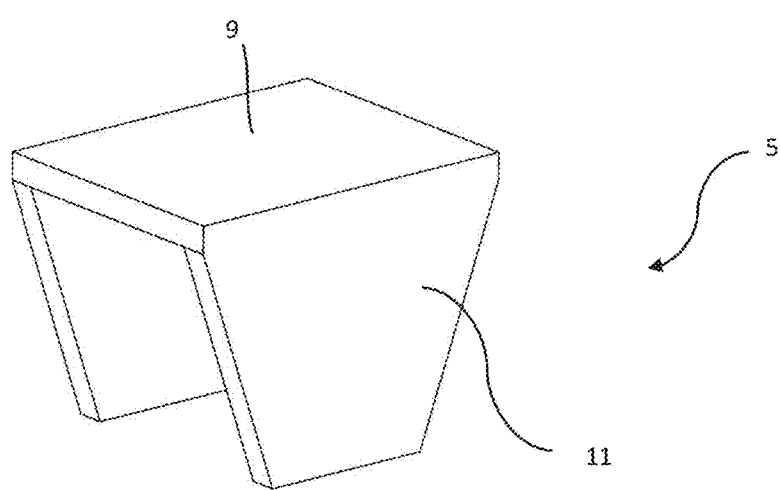

FIG. 23 illustrates a preferred stiffening module 5. This stiffening module is also illustrated in FIG. 3 and FIG. 10A, and serves as the starting point for the following FIGS. 24A-C.

Figure 24A:
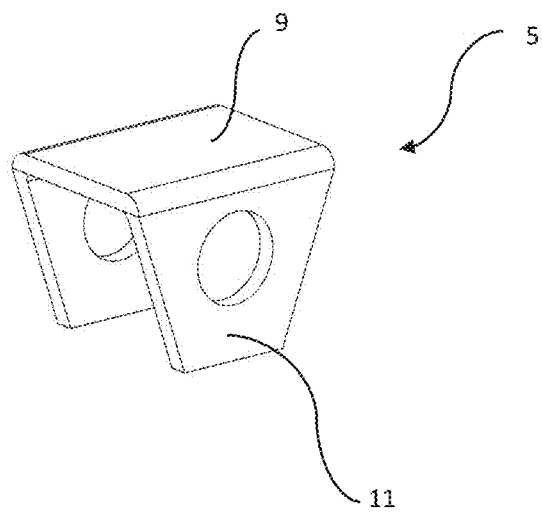
Figure 24B:
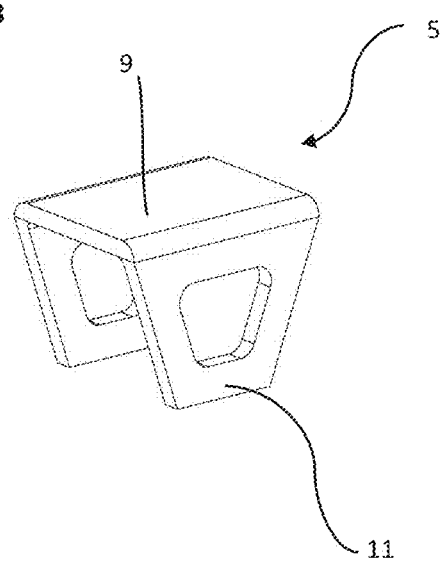
Figure 24C:
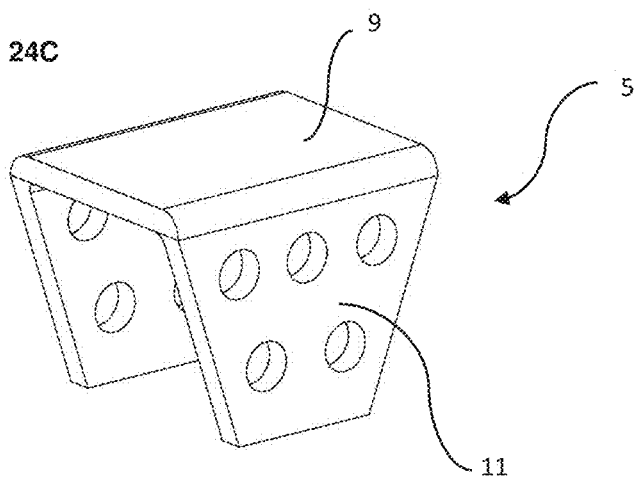

The stiffening modules 5 illustrated in FIGS. 24A-C are based on the previous stiffening module 5 illustrated in FIG. 23. However, the illustrated stiffening modules 5 have openings or gaps or spaces in the webs 11. This allows for further increased material savings with respect to a stiffening structure 3 and/or a stiffening system 1. These can take any shape (for example, round, FIG. 24A and FIG. 24C and/or trapezoidal, FIG. 24B). However, any polygons are also possible. Furthermore, a plurality of openings may also be included in a web 11.

Figure 25A:
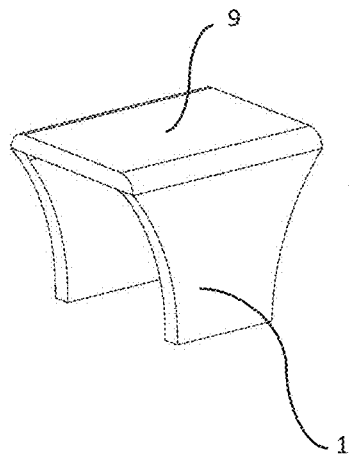

FIG. 25A shows a preferred stiffening module 5 having two webs 11 extending substantially parallel to each other, the webs 11 tapering along their height. In addition, the flange edges have a chamfer.

Figure 25B:
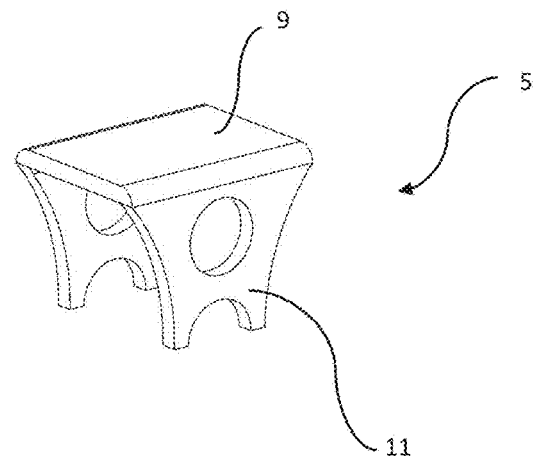

FIG. 25B illustrates another preferred stiffening module 5 having two substantially parallel webs 11, the webs 11 tapering along their height and the webs 11 having openings in the side surfaces.

Figure 26:
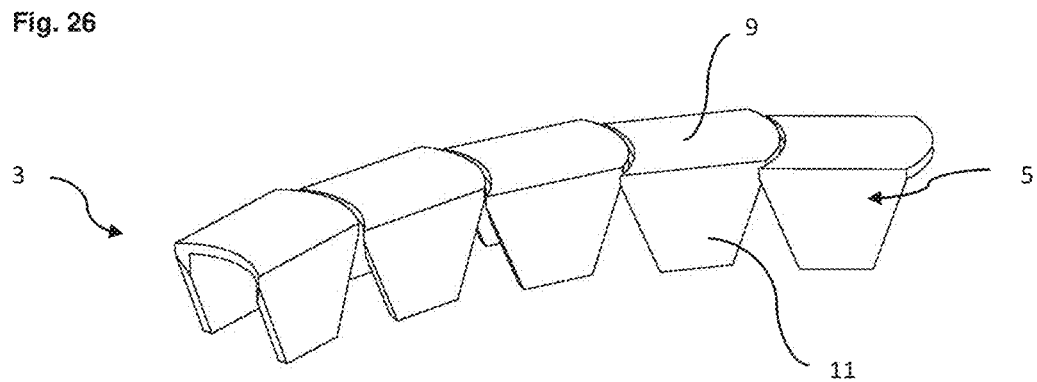

FIG. 26 shows a preferred stiffening structure 3 comprising five stiffening modules 5. The stiffening modules 5 each have two webs 11 running substantially parallel to one another. In addition, these are connected to each other by a flange 9, the flange 9 having a convex and concave end face.

Figure 27:
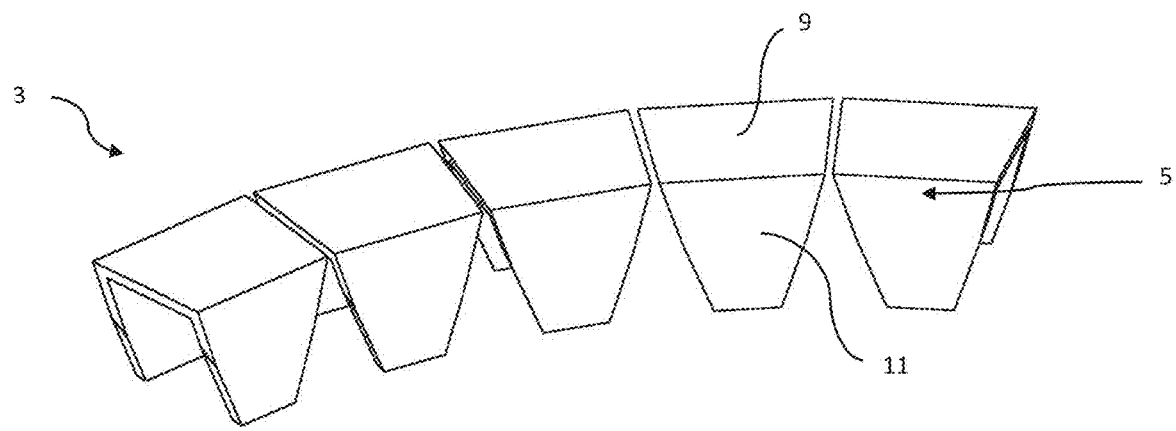

FIG. 27 shows a further preferred stiffening structure 3 with five stiffening modules 5. The stiffening modules 5 are connected to each other by their flanges 9. The flanges 9 have rectilinear flanges faces. The flanges surfaces of the flanges 9 are trapezoidal in shape.

Figure 28:
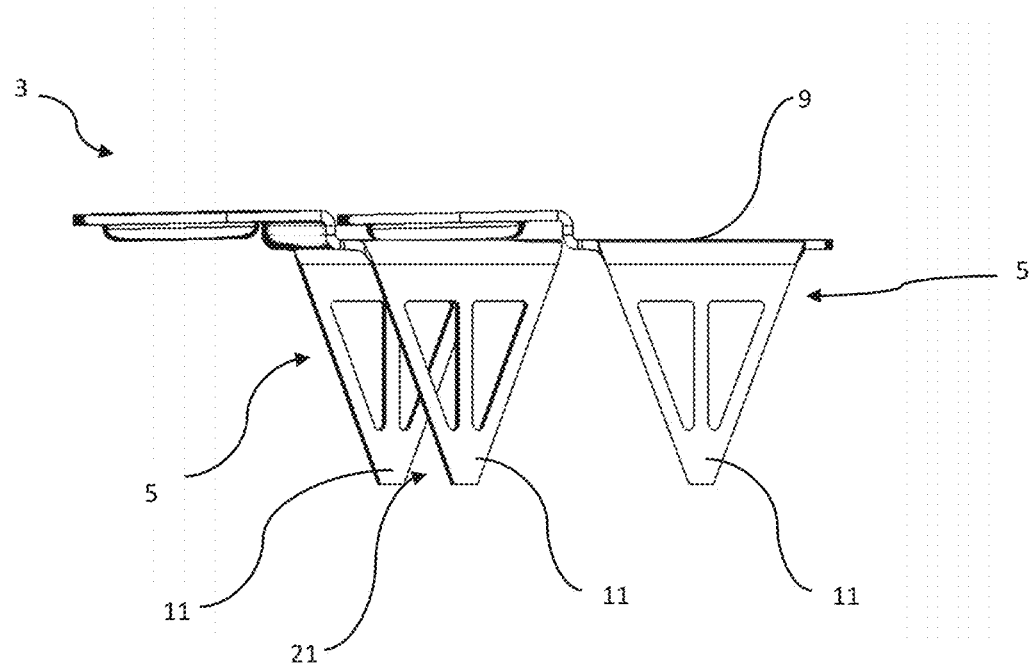

FIG. 28 shows another preferred stiffening structure 3 comprising two stiffening modules 5 from a side view. The stiffening modules 5 preferably each comprise a flange 9 and two webs 11, the webs 11 being spaced apart from each other in a gap 21 and aligned substantially parallel to each other. The flange 9, on the other hand, is preferably configured in two parts: A first partial element preferably serves as an overlapping surface, whereas a second partial element preferably serves as a base surface. The base surface preferably connects the two webs 11 to each other and is accordingly to be regarded as a bridging element. Starting from the base surface, the flange 9 has an extension which preferably defines the overlap surface. The overlap surface or the extension is preferably offset in height from the base surface by a heel. The stiffening modules 5 are further connected to each other sequentially via their flanges 9, wherein the base surface of a preceding stiffening module 5 overlaps with the overlap surface of a succeeding stiffening module 5. In other words, the overlap surface of a second stiffening module 5 preferably overlies the base surface of a first stiffening module 5. Via laser beam welding, resistance spot welding or other joining methods, the two surfaces are preferably materially bonded to each other. In addition, the webs 11 preferably have gaps or openings, which leads in particular to a weight saving. In addition, the webs 11 taper from the flange 9 in the direction of a contact surface.

Figure 29:
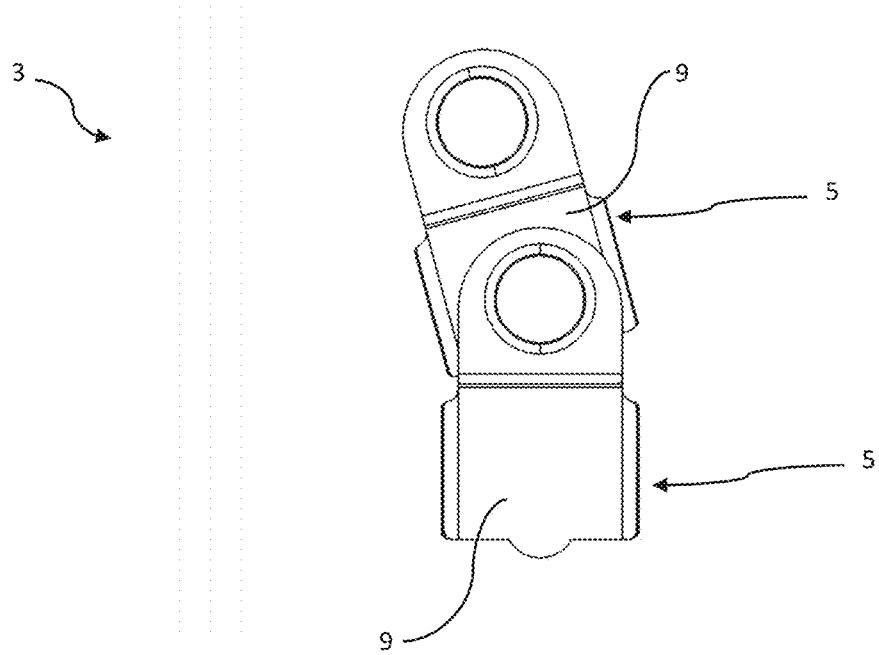

FIG. 29 and FIG. 30 show a preferred stiffening structure 3 comprising stiffening modules 5 with overlapping flanges 9 in a top view (FIG. 29) and in a rear oblique view (FIG. 30). The preferred embodiments shown in both figures correspond to the embodiment already described in FIG. 28 and show it in two further perspectives.

LIST OF REFERENCE NUMERALS

1 Stiffening system
3 Stiffening structure
5 Stiffening module
7 Sheet element
9 Flange
11 Web
13 Contact surface
15 Web contact line
21 Gap

BIBLIOGRAPHY

P. Sommer, Biologically inspired surface stiffeners modelled on diatoms, Bremerhaven: Bachelor thesis, 2014.
Wirtschaftsvereinigung Stahl, "Facts on the Steel Industry in Germany 2017," Düsseldorf, 2018.
J. Nickel, F. Fischer, M. Friedrich, C. Hühne, H. Mike, J. König, G. Kopp, and J. Wolff, Project study: Use of CFRP lightweight fiber composite technologies in railway vehicle construction, Meinders & Elstermann, 2016.
Bahnindustrie.info, "Lightweight construction: less weight, less consumption," 01 2018. [Online]. Available: https://bahnindustrie.info/de/positionen/vdb_politikbriefe/detail/leichtbau_weniger_gewicht_weniger_verbrauch/. [Accessed 29 04 20].
Ingenieur.de, "Aluminum allows lightweight innovations," 09 2010. [Online]. Available: https://www.ingenieur.de/technik/fachbereiche/werkstoffe/aluminium-erlaubt-leichtbauinnovationen/. [Accessed 29 04 20].
T. Keilig and A. Schmidt, "Weight prediction of CFRP fuselages for future passenger aircraft," in *German Aerospace Congress,* 2002.
F. f. E. mbH, "CO2 reduction in primary aluminum manufacturing", 2018.
Federal Ministry for Economic Affairs and Energy, "Lightweight construction", [Online]. Available: https://www.bmwi.de/Redaktion/DE/Dossier/leichtbau.html. [Accessed 29 04 20].
J. Graichen, S. Gores, and A. Herold, "Revision of the aviation emissions inventory," Federal Environment Agency, Dessau Rosslau, 2010. Calculation: 5333 kg/100 kg×10,0001×25a×0.8 kg/1×3.15 kgCO2/kg

The invention claimed is:

1. A method for stiffening a sheet element (7) comprising:
   provision of stiffening modules (5) comprising a flange (9) and a web (11)',
   connecting the stiffening modules (5) sequentially along a load path on the sheet element (7), wherein the stiffening modules (5) are connected via their respective flanges (9) to form a stiffening structure (3), such that the stiffening modules (5) have a combined effect, specifically stiffening and reinforcing the sheet element (7) along the load path,
   wherein the load path for the sheet element (7) has been determined in a topology-optimized manner on the basis of at least one of a stress-optimized simulation or calculation, and wherein the load path is not rectilinear with respect to a surface plane of the sheet element (7) and does not extend in a straight line along the sheet element (7), but has at least one change in direction within the surface plane of the sheet element (7).

2. The method according to claim 1
characterized in that
the webs (11) of the stiffening modules (5) form contact lines with the sheet element (7), the contact lines of the webs (11) along a stiffening structure (3) not being a continuous line.

3. The method according to claim 1
characterized in that
the contact length of the webs (11) with the sheet element (7) along a load path is shorter than the total length of the stiffening structure (3).

4. The method according to claim 1
characterized in that
the following steps are comprised:
   determining the load path on the sheet element (7) based on at least one of calculations or simulations;
   designing of a stiffening model along the load path;
   sequencing of the stiffening model along the load path into modular units; and
   designing and manufacturing of the stiffening modules (5) on the basis of modular units determined by said sequencing.

5. The method according to claim 1 characterized in that
the webs (11) of the stiffening modules (5) have contact surfaces (13) and the stiffening modules (5) are attached to the contact surfaces (13) on the sheet element (7).

6. The method according to claim 1 characterized in that
the stiffening modules (5) are manufactured by separation processes or forming processes, wherein the web (11) and the flange (9) of a stiffening module
(i) are respectively manufactured from separate semi-finished products, such that the web (11) and the flange (9) can be joined together or;
(ii) are manufactured from an identical semi-finished product by means of a forming process.

7. The method according to claim 6 characterized in that
the stiffening modules (5) are manufactured by at least one of laser cutting, edging, and bending.

8. The method according to claim 1 characterized in that
the stiffening modules (5) are connected together by a joining process selected from the group consisting of: welding, soldering, screwing, riveting, and gluing.

9. The method according to claim 1 characterized in that
the sheet element (7) is a component to be stiffened of a vehicle.

10. The method according to claim 1 characterized in that
the stiffening modules (5) are joined together by laser beam welding.

11. The method according to claim 1 characterized in that
the sheet element (7) is a body component to be stiffened of a vehicle selected from a group consisting of a railway vehicle, an aircraft, and a ship.

12. The method according to claim 1 characterized in that
the sheet element (7) is a component to be stiffened which has dimensions of more than one meter.

13. The method according to claim 1 characterized in that
the process is used in the body production of vehicles and for the stiffening of load bearing body components.

14. The method according to claim 1 characterized in that
the connecting the stiffening modules via their respective flanges (9) results in a stiffening structure (3) exhibiting a continuous overall flange.

* * * * *